United States Patent
Akimoto et al.

(10) Patent No.: US 8,492,759 B2
(45) Date of Patent: Jul. 23, 2013

(54) FIELD EFFECT TRANSISTOR

(75) Inventors: Kengo Akimoto, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 225 days.

(21) Appl. No.: 12/960,636

(22) Filed: Dec. 6, 2010

(65) Prior Publication Data

US 2011/0140098 A1 Jun. 16, 2011

(30) Foreign Application Priority Data

Dec. 11, 2009 (JP) ................................. 2009-281408

(51) Int. Cl.
*H01L 29/12* (2006.01)

(52) U.S. Cl.
USPC ..................................... 257/43; 257/E29.296

(58) Field of Classification Search
USPC ........................................... 257/43, E29.296
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, Or Al; B: Mg, Mn, Fe, Ni, Cu, or Zn] at Temperatures Over 1000°C." Journal of Solid State Chemistry, 1985, vol. 60, pp. 382-384.

(Continued)

*Primary Examiner* — David S Blum
(74) *Attorney, Agent, or Firm* — Eric J. Robinson; Robinson Intellectual Property Law Office, P.C.

(57) ABSTRACT

It is an object to provide a low-cost oxide semiconductor material which is excellent in controllability of the carrier concentration and stability, and to provide a field effect transistor including the oxide semiconductor material. An oxide including indium, silicon, and zinc is used as the oxide semiconductor material. Here, the content of silicon in the oxide semiconductor film is greater than or equal to 4 mol % and less than or equal to 8 mol %. The field effect transistor including such an In—Si—Zn—O film can withstand heat treatment at a high temperature and is effective against –BT stress.

13 Claims, 26 Drawing Sheets

U.S. PATENT DOCUMENTS

| | | | |
|---|---|---|---|
| 7,211,825 | B2 | 5/2007 | Shih et al |
| 7,282,782 | B2 | 10/2007 | Hoffman et al. |
| 7,291,967 | B2 | 11/2007 | Sakata et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,492,090 | B2 | 2/2009 | Yamazaki et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,791,074 | B2 | 9/2010 | Iwasaki |
| 7,910,932 | B2 * | 3/2011 | Marks et al. .......... 257/72 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0045397 | A1 | 2/2009 | Iwasaki |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0258794 | A1 | 10/2010 | Iwasaki et al. |
| 2010/0276689 | A1 | 11/2010 | Iwasaki |
| 2010/0279462 | A1 | 11/2010 | Iwasaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 | 9/1993 |
| JP | 08-264794 | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 | 3/2003 |
| JP | 2003-086808 | 3/2003 |
| JP | 2004-103957 | 4/2004 |
| JP | 2004-273614 A | 9/2004 |
| JP | 2004-273732 A | 9/2004 |
| JP | 2006-173580 | 6/2006 |
| JP | 2007-096055 | 4/2007 |
| JP | 2007-123861 | 5/2007 |
| WO | WO 2004/114391 | 12/2004 |
| WO | WO-2007/029844 | 3/2007 |
| WO | WO 2008/133457 | 11/2008 |
| WO | WO-2009/031634 | 3/2009 |

OTHER PUBLICATIONS

Kimizuka et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$-$ZnGa_2O_4$-ZnO System," Journal of Solid State Chemistry, Apr. 1, 1995, vol. 116, No. 1, pp. 170-178.

Nakamura et al., "The Phase Relations in the $In_2$-$Ga_2ZnO_4$-ZnO System at 1350°C.," Journal of Solid State Chemistry, Aug. 1, 1991, vol. 93, No. 2, pp. 298-315.

Li et al., "Modulated Structures of Homologous Compounds $InMO_3(ZnO)m$ (M=In,Ga; m=Integer) Described by Four-Dimensional Superspace Group," Journal of Solid State Chemistry, 1998, vol. 139, pp. 347-355.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Thin-Film Transistor Fabricated in Single-Crystalline Transparent Oxide Semiconductor," Science, May 23, 2003, vol. 300, No. 5623, pp. 1269-1272.

Lee et al., "Current Status of, Challenges to, and Perspective View of AM-OLED," IDW '06: Proceedings of the 13th International Display Workshops, Dec. 7, 2006, pp. 663-666.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Tsuda et al., "Ultra Low Power Consumption Technologies for Mobile TFT-LCDs," IDW '02: Proceedings of the $9_{th}$ International Display Workshops, Dec. 4, 2002, pp. 295-298.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Ikeda et al., "Full-Functional System Liquid Crystal Display using CG-Silicon Technology," SID Digest '04: SID International Symposium Digest of Technical Papers, 2004, vol. 35, pp. 860-863.

Kurokawa et al., "UHF RFCPUs on Flexible and Glass Substrates for Secure RFID Systems," Journal of Solid-State Circuits, 2008, vol. 43, No. 1, pp. 292-299.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hirao et al., "Novel Top-Gate Zinc Oxide Thin-Film Transistors (ZnO TFTs) for AMLCDs," Journal of the SID, 2007, vol. 15, No. 1, pp. 17-22.

Lee et al., "World's Largest (15-inch) XGA AMLCD Panel using IGZO Oxide TFT," SID Digest '08: SID International Symposium Digest of Technical Papers, May 20, 2008, vol. 39, pp. 625-628.

Park et al., "Challenge to Future Displays: Transparent AM-OLED Driven by PEALD Grown ZnO TFT," IMID '07 Digest, 2007, pp. 1249-1252.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Kitzerow et al., "Observation of Blue Phases in Chiral Networks," Liquid Crystals, 1993, vol. 14, No. 3, pp. 911-916.

Kikuchi et al., "Polymer-Stabilized Liquid Crystal Blue Phases," Nature Materials, Sep. 2, 2002, vol. 1, pp. 64-68.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Park et al., "High performance amorphous oxide thin film transistors with self-aligned top-gate structure," IEDM 09: Technical Digest of International Electron Devices Meeting, Dec. 7, 2009, pp. 191-194.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Prins et al., "A Ferroelectric Transparent Thin-Film Transistor," Appl. Phys. Lett. (Applied Physics Letters), Jun. 17, 1996, vol. 68, No. 25, pp. 3650-3652.

Takahashi et al., "Theoretical Analysis of IGZO Transparent Amorphous Oxide Semiconductor," IDW '08: Proceedings of the $15^{th}$ International Display Workshops, Dec. 3, 2008, pp. 1637-1640.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Ohara et al., "21.3: 4.0 IN. QVGA AMOLED Display Using In-Ga-Zn-Oxide TFTs with a Novel Passivation Layer," SID Digest '09: SID International Symposium Digest of Technical Papers, May 31, 2009, pp. 284-287.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Osada et al., "Development of Driver-Integrated Panel using Amorphous In-Ga-Zn-Oxide TFT," AM-FPD '09 Digest of Technical Papers, Jul. 1, 2009, pp. 33-36.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Sakata et al., "Development of 4.0-In. AMOLED Display with Driver Circuit Using Amorphous In-Ga-Zn-Oxide TFTs," IDW '09: Proceedings of the $16^{th}$ International Display Workshops, 2009, pp. 689-692.

International Search Report (Application No. PCT/JP2010/070063) Dated Dec. 14, 2010.

Written Opinion (Application No. PCT/JP2010/070063) Dated Dec. 14, 2010.

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

Park.J et al., "Improvements in the Device Characteristics of Amorphous Indium Gallium Zinc Oxide Thin-Film Transistors By Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA Amoled Driven by the Threshold Voltage Controlled Amorphous Gizo (Ga2O3-In2O3-ZnO) TFT," , SID Digest '08: SID International Symposium Digest of Technical Papers, May 20, 2008, vol. 39, pp. 633-636.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Nakamura.M, "Synthesis of Homologous Compound with New Long-Period Structure,", Nirim Newsletter, Mar. 1, 1995, vol. pp. 1-4.

Park.Sang-Hee et al., "42.3: Transparent ZnO Thin Film Transistor for the Application of High Aperture Ratio.Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys.Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29: Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous.oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size Amoled Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vaccum Science & Technology B), Mar. 1, 2003, vol. 21, No. 2, pp. 800-803.

Oh.M et al., "Improving the Gate Stability of ZnO Thin-Film Transistors With Aluminum Ocide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 with Sputtered Al2O3 Gate Insulator,", Appl. Phys. Lett. (Applied Physics Letters), Sep. 1, 2003, vol. 83 No. 9, pp. 1755-1757.

\* cited by examiner

FIELD EFFECT TRANSISTOR

TECHNICAL FIELD

The present invention relates to a field effect transistor including an oxide semiconductor.

BACKGROUND ART

In recent years, an oxide semiconductor has attracted attention as a novel semiconductor material having high mobility, which is an advantage of polysilicon, and a uniform element characteristic, which is an advantage of amorphous silicon.

In Patent Document 1, a field effect transistor which includes, as an oxide semiconductor, an oxide including indium (In), zinc (Zn), and gallium (Ga) (a material having an In—Ga—Zn—O composition) has been proposed.

[Reference]

[Patent Document 1] Japanese Published Patent Application No. 2006-173580

DISCLOSURE OF INVENTION

However, a material having an In—Ga—Zn—O composition includes an expensive raw material and thus has a problem of high cost.

In view of the above problem, it is an object to provide a low-cost oxide semiconductor material that is excellent in controllability of carrier concentration and stability, and to provide a field effect transistor including the oxide semiconductor material.

An oxide including indium (In), silicon (Si), and zinc (Zn) (a material having an In—Si—Zn—O composition) is used as an oxide semiconductor material. Here, the content of Si in the oxide semiconductor film is greater than or equal to 4 mol % and less than or equal to 8 mol %.

An embodiment of the present invention is a field effect transistor including a gate electrode, a gate insulating film, an oxide semiconductor film, a source electrode, and a drain electrode. In the field effect transistor, the oxide semiconductor film is an oxide including indium, silicon, and zinc, and the content of silicon in the oxide semiconductor film is greater than or equal to 4 mol % and less than or equal to 8 mol %.

With the use of a material having an In—Si—Zn—O composition, a field effect transistor having stable characteristics can be provided at low cost.

BEST MODE FOR CARRYING OUT THE INVENTION

Embodiments of the invention disclosed in this specification will be described below with reference to the drawings. Note that the invention is not limited to the following description, and it is easily understood by those skilled in the art that modes and details of the invention can be modified in various ways without departing from the spirit and the scope of the invention. Therefore, the invention should not be construed as being limited to the following description of the embodiments.

(Embodiment 1)

Figure 1:
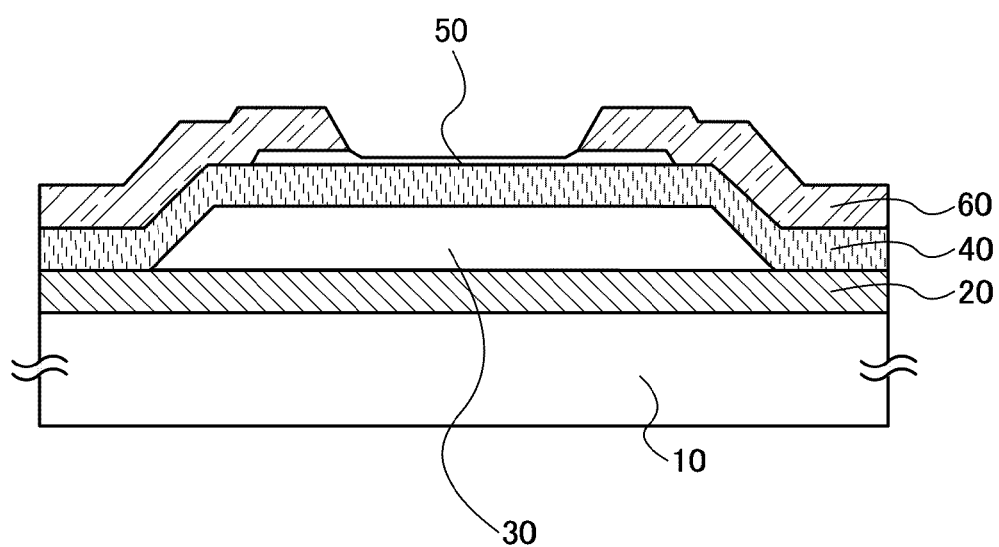
FIG. 1 is a cross-sectional schematic view of a field effect transistor including an oxide semiconductor.

FIG. 1 is a cross-sectional schematic view of a field effect transistor including an oxide semiconductor. The field effect transistor includes a substrate 10, a base insulating film 20, a gate electrode 30, a gate insulating film 40, an oxide semiconductor film 50, and a metal film 60. Note that the oxide semiconductor film 50 is an In—Si—Zn—O film.

The field effect transistor illustrated in FIG. 1 has a channel-etched bottom-gate structure. Note that the structure of the field effect transistor is not limited thereto, and can be a desired top-gate or bottom-gate structure.

It is appropriate that a glass substrate is used as the substrate 10. In the case where heat treatment is performed later at a high temperature, a glass substrate whose strain point is 730° C. or higher is preferably used. In addition, from the viewpoint of heat resistance, a glass substrate which includes more barium oxide (BaO) than boron oxide ($B_2O_3$) is preferably used.

A substrate formed using an insulator such as a ceramic substrate, a quartz glass substrate, a quartz substrate, or a sapphire substrate may also be used as the substrate 10 instead of the glass substrate. Alternatively, a crystallized glass substrate or the like can be used as the substrate 10.

The base insulating film 20 has a function of preventing diffusion of an impurity element from the substrate 10. Note that the base insulating film 20 can be formed using one or more films selected from a silicon oxide film, a silicon nitride film, a silicon oxynitride film, and a silicon nitride oxide film.

Note that in the case where an insulating substrate is used as the substrate 10, the base insulating film 20 does not need to be provided. That is, the gate electrode 30 may be formed over the substrate 10 having an insulating surface.

A metal conductive film can be used as the gate electrode 30. As a material of the metal conductive film, an element selected from aluminum (Al), chromium (Cr), copper (Cu), tantalum (Ta), titanium (Ti), molybdenum (Mo), and tungsten (W); an alloy including any of these elements as a component; or the like can be used. For example, a three-layer structure of a titanium film, an aluminum film, and a titanium film; a three-layer structure of a molybdenum film, an aluminum film, and a molybdenum film; or the like can be employed. Note that the metal conductive film is not limited to a three-layer structure, and may have a single-layer structure, a two-layer structure, or a stacked structure of four or more layers.

The gate insulating film 40 is in contact with the oxide semiconductor film 50 and thus is preferably a dense film with high withstand voltage. Therefore, it is particularly preferable that the gate insulating film 40 be formed by a high-density plasma CVD method using a microwave (2.45 GHz). This is for reduction of plasma damage in the formation of the gate insulating film 40. As a result, defects generated in the gate insulating film 40 can be reduced, and the condition of an interface with the oxide semiconductor film 50 formed later can be favorable. If the condition of the interface between the oxide semiconductor film 50 and the gate insulating film 40 is unfavorable, a dangling bond generated when a bond between an impurity and a main component of the oxide semiconductor is cut causes a shift in threshold voltage in a bias-temperature (BT) test, which is a typical test for evaluating reliability of a field effect transistor.

It is preferable that the gate insulating film 40 include impurities such as moisture and hydrogen as little as possible. In addition, the gate insulating film 40 can be formed using a film of silicon oxide, silicon nitride, silicon oxynitride, silicon nitride oxide, aluminum oxide, aluminum nitride, aluminum oxynitride, aluminum nitride oxide, hafnium oxide, or the like.

The oxide semiconductor film 50 is the In—Si—Zn—O film as described above, and the Si content in the film is greater than or equal to 4 mol % and less than or equal to 8 mol %.

Impurities such as hydrogen, moisture, a hydroxyl group, and hydroxide (also referred to as a hydrogen compound) which are thought to act as donors are intentionally removed from the oxide semiconductor film 50, and then oxygen which is simultaneously reduced in the step of removing these impurities is supplied to the oxide semiconductor film 50. Accordingly, the oxide semiconductor film 50 is purified and becomes electrically i-type (intrinsic). The purpose of this treatment is to suppress fluctuation in electric characteristics of the field effect transistor.

The smaller the concentration of hydrogen in the oxide semiconductor film 50 is, the closer to the i-type the oxide semiconductor film 50 is. Therefore, the concentration of hydrogen included in the oxide semiconductor film 50 is preferably $5 \times 10^{19}$ atoms/cm$^3$ or lower, more preferably $5 \times 10^{18}$ atoms/cm$^3$ or lower, still more preferably $5 \times 10^{17}$ atoms/cm$^3$ or lower, further more preferably lower than $5 \times 10^{16}$ atoms/cm$^3$. The concentration of hydrogen can be measured by secondary ion mass spectrometry (SIMS).

In an oxide semiconductor, which is a wide bandgap semiconductor, the density of minority carriers is low and the minority carriers are less likely to be induced. Thus, it can be said that, in the field effect transistor including the oxide semiconductor film 50, tunnel current is difficult to be generated; consequently, off-state current is difficult to flow.

In addition, impact ionization and avalanche breakdown are less likely to occur in the field effect transistor including the oxide semiconductor film 50 which is formed using a wide bandgap semiconductor. Therefore, it can be said that the field effect transistor including the oxide semiconductor film 50 has resistance to hot carrier deterioration. This is because hot carrier deterioration is mainly caused by increase in the number of carriers due to avalanche breakdown and by injection of the carriers accelerated to high speed to the gate insulating film.

The metal film 60 is used as a source electrode or a drain electrode. For the metal film 60, a metal material such as aluminum (Al), chromium (Cr), copper (Cu), tantalum (Ta), titanium (Ti), molybdenum (Mo), or tungsten (W); or an alloy material including any of these metal materials as a component can be used. In addition, the metal film 60 may have a structure in which a film of refractory metal such as chromium (Cr), tantalum (Ta), titanium (Ti), molybdenum (Mo), or tungsten (W) is stacked on one side or both sides of a metal film of aluminum (Al), copper (Cu), or the like. Note that an aluminum material to which an element that prevents generation of hillocks or whiskers in an aluminum film, such as silicon (Si), titanium (Ti), tantalum (Ta), tungsten (W), molybdenum (Mo), chromium (Cr), neodymium (Nd), scandium (Sc), or yttrium (Y), is added is used, whereby the metal film 60 with high heat resistance can be obtained.

(Embodiment 2)

A manufacturing process of a field effect transistor having the structure illustrated in FIG. 1 will be described with reference to FIGS. 25A to 25D and FIGS. 26A to 26D.

Figure 25A:
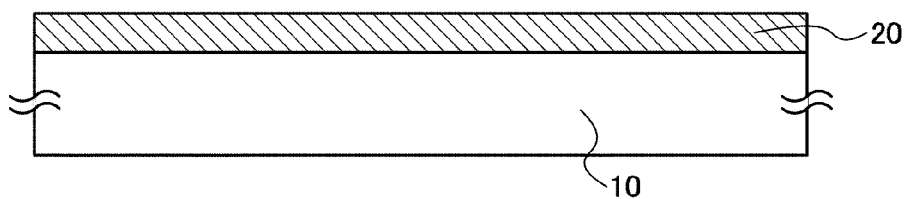
FIGS. 25A to 25D illustrate a manufacturing process of the field effect transistor illustrated in FIG. 1.
Figure 25B:
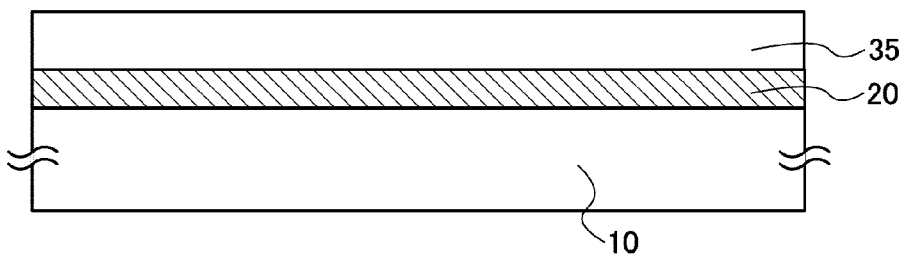
Figure 25C:
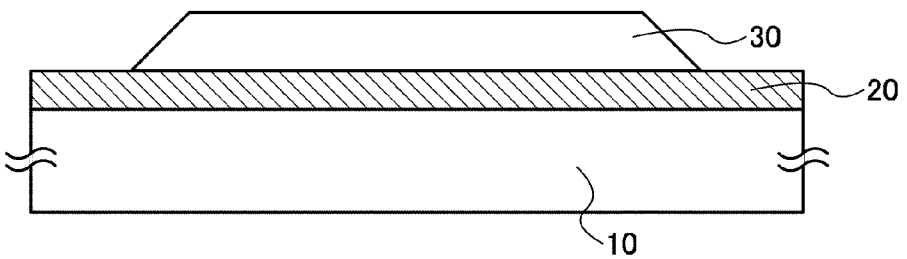
Figure 25D:
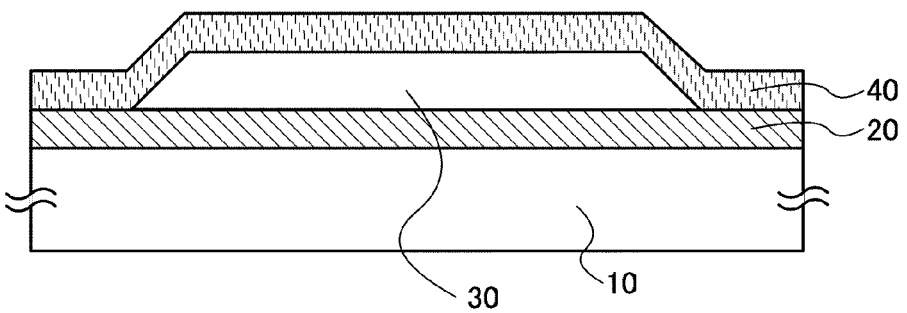
Figure 26A:
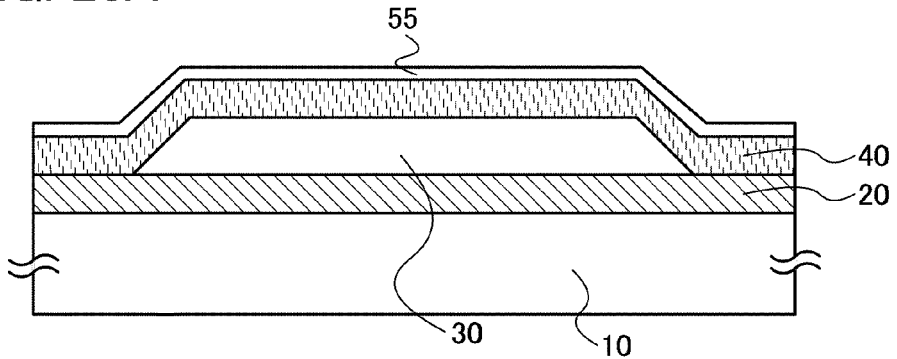
FIGS. 26A to 26D illustrate the manufacturing process of the field effect transistor illustrated in FIG. 1.
Figure 26B:
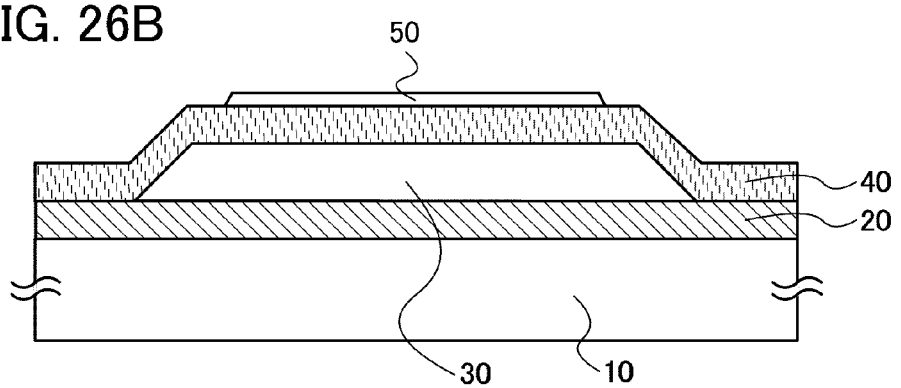
Figure 26C:
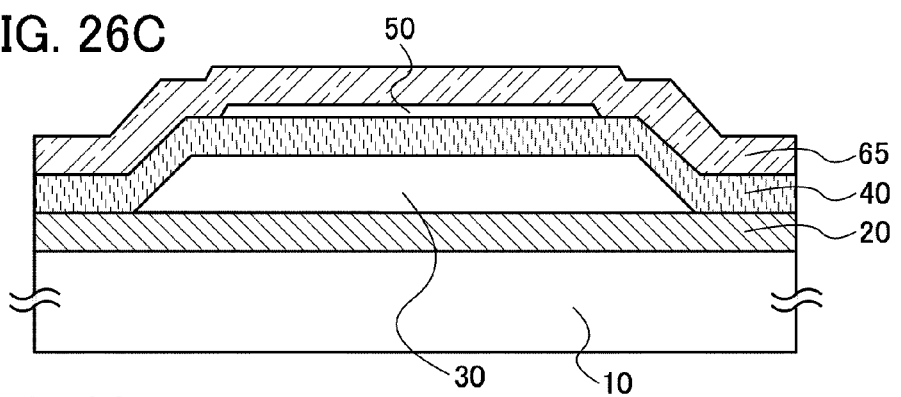
Figure 26D:
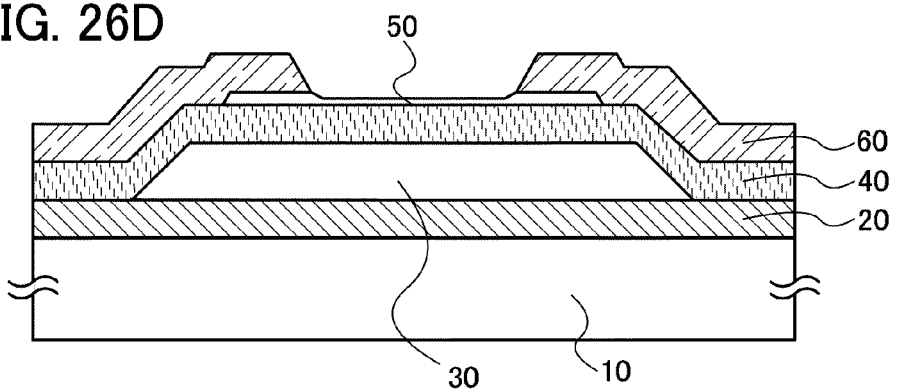

As illustrated in FIG. 25A, the base insulating film 20 is formed over the substrate 10. As illustrated in FIG. 25B, a conductive film 35 is formed over the base insulating film 20. As illustrated in FIG. 25C, the gate electrode 30 is formed in a first photolithography process. As illustrated in FIG. 25D, the gate insulating film 40 is formed over the gate electrode 30. As illustrated in FIG. 26A, an oxide semiconductor film 55 is formed over the gate insulating film 40. As illustrated in FIG. 26B, the oxide semiconductor film 55 is etched so that the oxide semiconductor film 50 is formed. As illustrated in FIG. 26C, a metal film 65 is formed over the oxide semiconductor film 50. As illustrated in FIG. 26D, the metal film 65 is etched so that the metal film 60 is formed. The field effect transistor illustrated in FIG. 1 is obtained through the above steps.

A supplementary explanation on some of the steps is given below.

In the formation step of the gate electrode 30 illustrated in FIG. 25C, a resist mask used in the first photolithography process may be formed by an inkjet method. When the resist mask is formed by an inkjet method, a photomask is not used; therefore, manufacturing cost can be reduced.

In the formation step of the gate insulating film 40 illustrated in FIG. 25D, the gate insulating film 40 is formed by a sputtering method, for example. It is preferable that, as pretreatment performed before the film formation, the substrate 10 provided with the gate electrode 30 be preheated in a preheating chamber of a sputtering apparatus so that impurities such as hydrogen and moisture adsorbed to the substrate 10 may be removed and eliminated. The purpose of this preheating is to prevent the impurities such as hydrogen and moisture from being included in the gate insulating film 40 and the oxide semiconductor film 50 which are formed later as much as possible. In addition, the substrate 10 over which films up to the gate insulating film 40 are formed may be preheated.

The appropriate temperature of the preheating is higher than or equal to 100° C. and lower than or equal to 400° C. A temperature of higher than or equal to 150° C. and lower than or equal to 300° C. is more preferable. In addition, a cryopump is preferably used as an evacuation unit in the preheating chamber.

In the formation step of the oxide semiconductor film 55 illustrated in FIG. 26A, the oxide semiconductor film 55 is formed by a sputtering method.

Before the oxide semiconductor film 55 is formed, the substrate 10 is held in a treatment chamber in a reduced pressure state, and the substrate 10 is heated to a temperature of higher than or equal to room temperature and lower than 400° C. Then, while a sputtering gas from which hydrogen and moisture are removed is introduced in the state where moisture remaining in the treatment chamber is removed, voltage is applied between the substrate 10 and a target, so that the oxide semiconductor film 55 is formed over the substrate 10.

It is appropriate that an entrapment vacuum pump is used as the evacuation unit for removing moisture remaining in the treatment chamber. For example, a cryopump, an ion pump, and a titanium sublimation pump can be given. Alternatively, a turbo pump provided with a cold trap can be used as the evacuation unit. From the treatment chamber, a compound including a hydrogen atom, such as water ($H_2O$), or the like (more preferably, also a compound including a carbon atom) is eliminated; thus, the concentration of impurities included in the oxide semiconductor film 55 which is formed in the treatment chamber can be reduced. Further, film formation by sputtering is performed while moisture remaining in the treatment chamber is removed with a cryopump; thus, the temperature of the substrate 10 at the time of forming the oxide semiconductor film 55 can be set higher than or equal to room temperature and lower than 400° C.

Note that before the oxide semiconductor film 55 is formed by a sputtering method, dust attached to a surface of the gate insulating film 40 is preferably removed by reverse sputtering. The reverse sputtering refers to a method in which a substrate surface is cleaned with reactive plasma generated by voltage application to the substrate side using an RF power source without voltage application to a target side. Note that the reverse sputtering is performed in an argon atmosphere. Alternatively, nitrogen, helium, oxygen, or the like may be used instead of argon.

After the etching step of the oxide semiconductor film 55 illustrated in FIG. 26B, heat treatment for dehydration or dehydrogenation of the oxide semiconductor film 50 is performed. It is appropriate that the heat treatment for dehydration or dehydrogenation is performed at a temperature of higher than or equal to 350° C. and lower than or equal to 750° C.

For example, the heat treatment for dehydration or dehydrogenation is performed in a nitrogen atmosphere by putting the substrate 10 provided with the oxide semiconductor film 50 in an electric furnace which is a kind of heat treatment apparatus. After that, a high-purity oxygen gas, a high-purity dinitrogen monoxide ($N_2O$) gas, or ultra-dry air (a gas in which nitrogen and oxygen are mixed at a ratio of 4:1 and which has a dew point of −40° C. or lower, preferably −60° C. or lower) is introduced into the same furnace and cooling is performed. It is preferable that water, hydrogen, and the like be not included in the oxygen gas or the $N_2O$ gas. In addition, it is appropriate that the purity of an oxygen gas or an $N_2O$ gas is 6N (99.9999%) or higher, preferably 7N (99.99999%) or higher (i.e., the concentration of impurities in the oxygen gas or the $N_2O$ gas is 1 ppm or lower, more preferably 0.1 ppm or lower).

Note that the heat treatment apparatus is not limited to the electric furnace; for example, a rapid thermal anneal (RTA) apparatus such as a gas rapid thermal anneal (GRTA) apparatus or a lamp rapid thermal anneal (LRTA) apparatus can be used.

Note that the heat treatment for dehydration or dehydrogenation may be performed after the formation step of the oxide semiconductor film illustrated in FIG. 26A.

Example 1

<In—Si—Zn—O film>

Four kinds of In—Si—Zn—O films were formed using targets having different compositions, and characteristics of the In—Si—Zn—O films were compared. The compositions of the targets are the following [1] to [4]:

[1] $In_2O_3$:ZnO=1:2 [mol] (Si=0 [mol %]);

[2] $In_2O_3$:ZnO:$SiO_2$=1:2:0.2 [mol] (Si=2 [mol %]);

[3] $In_2O_3$:ZnO:$SiO_2$=1:2:0.4 [mol] (Si=4 [mol %]); and

[4] $In_2O_3$:ZnO:$SiO_2$=1:2:1.0 [mol] (Si=8 [mol %]).

Figure 2:
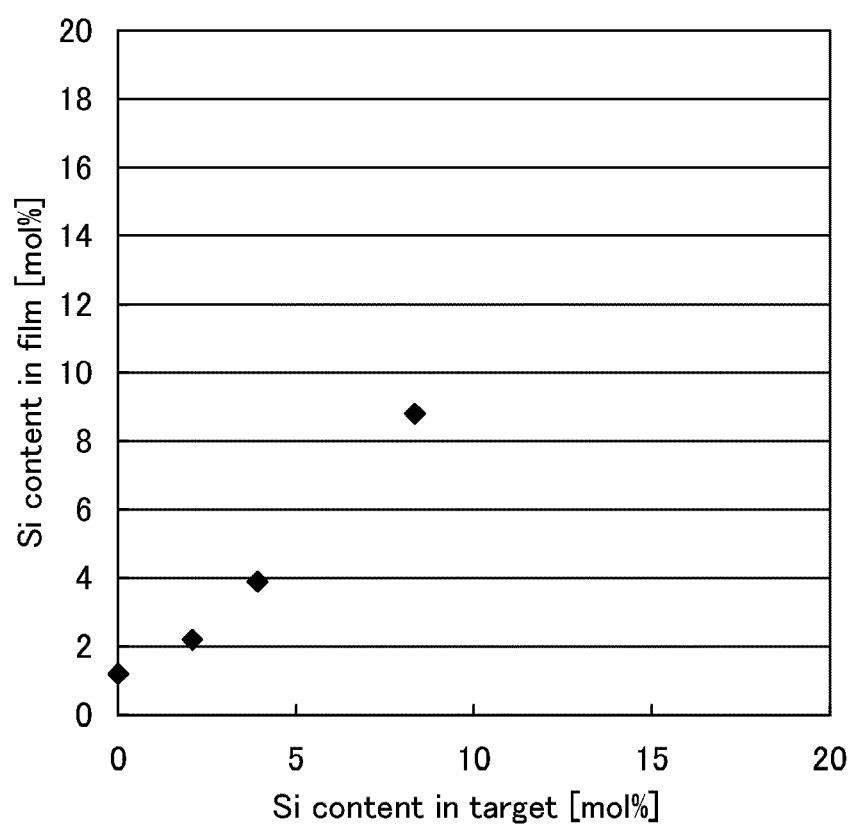
FIG. 2 is a graph showing results of comparison between the Si content in an In—Si—Zn—O target and the Si content in an In—Si—Zn—O film.

FIG. 2 is a graph showing results of comparison between the Si content in an In—Si—Zn—O target and the Si content in an In—Si—Zn—O film. In this graph, the horizontal axis represents the Si content (mol %) in the target, and the vertical axis represents the Si content (mol %) in the film. This graph shows that the Si content in the target is substantially equal to the Si content in the film.

The Si content in the target shown in the graph of FIG. 2 was obtained by calculation. In addition, the Si content in the film was measured by Rutherford backscattering spectrometry (RBS). The values of the Si contents are shown in Table 1. In this specification, the Si content is expressed as Si=0, 2, 4, or 8 [mol %] just for simplicity.

TABLE 1

| Si content in target [mol %] | Si content in film [mol %] |
|---|---|
| 0 | 1.2 |
| 2.1 | 2.2 |
| 3.9 | 3.9 |
| 8.3 | 8.8 |

Figure 3:
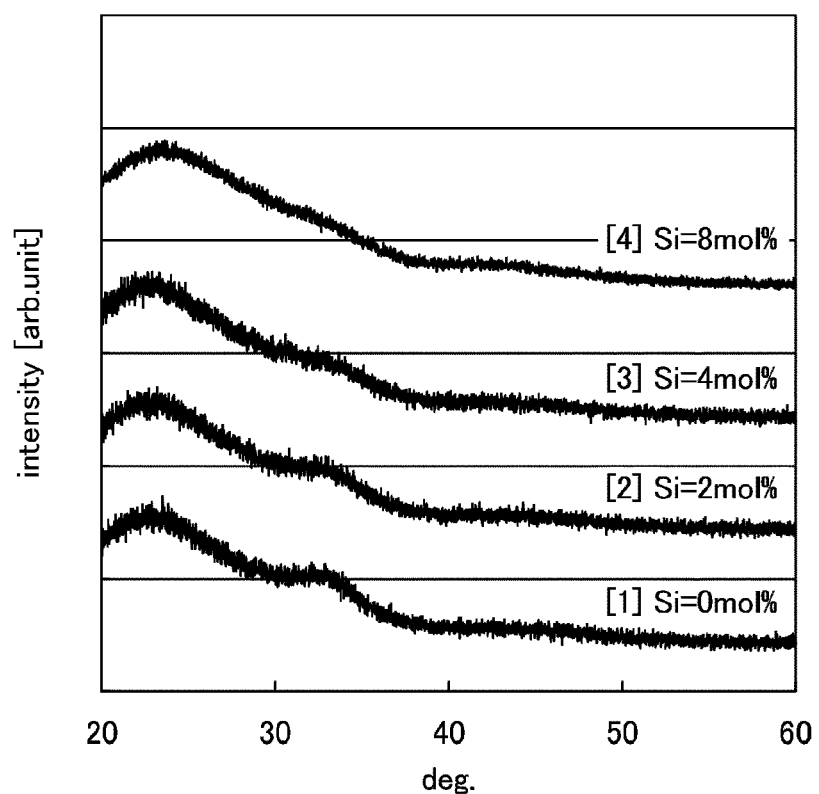
FIG. 3 is a graph showing results of measuring an In—Si—Zn—O film by an X-ray diffraction (XRD) analysis method.

FIG. 3 is a graph showing results of measuring an In—Si—Zn—O film by an X-ray diffraction (XRD) analysis method. In this graph, the horizontal axis represents the irradiation angle of an X ray, and the vertical axis represents the intensity of a peak. This graph shows that as the Si content in the film is increased, the intensity of a broad peak at 30 deg. to 35 deg. due to In—Zn—O is weakened.

Figure 4:
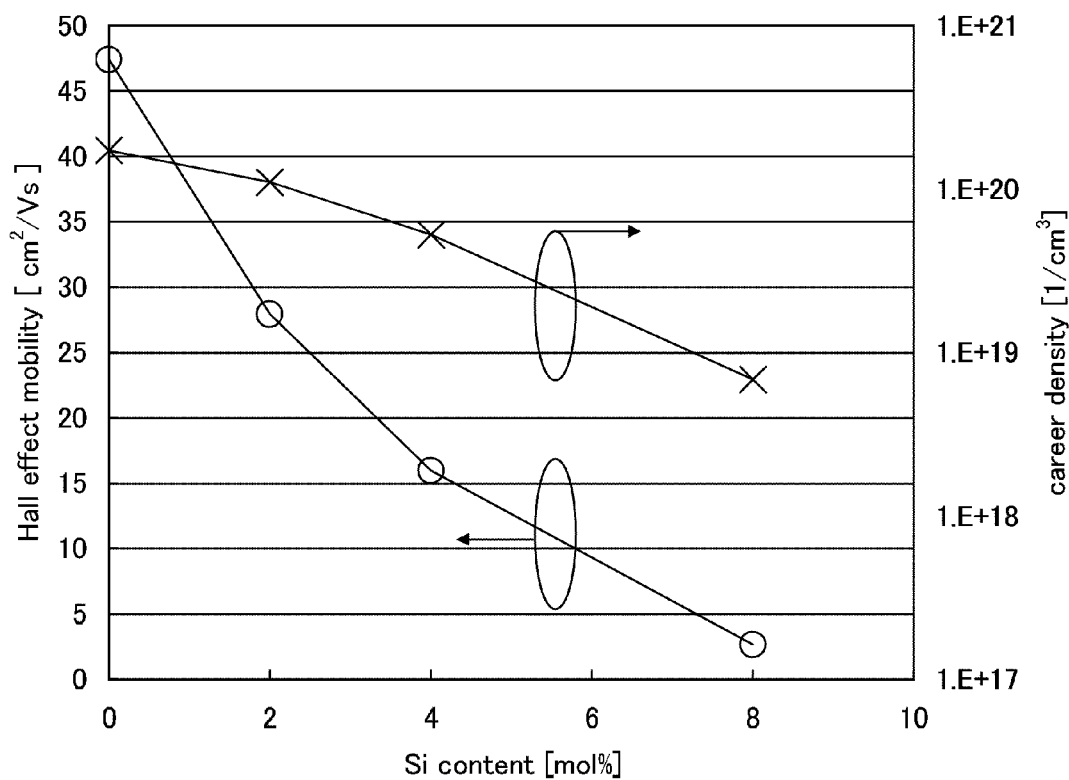
FIG. 4 is a graph showing dependence of Hall effect mobility of an In—Si—Zn—O film on the Si content in the film.

FIG. 4 is a graph showing dependence of Hall effect mobility of an In—Si—Zn—O film on the Si content in the film. In this graph, the horizontal axis represents the Si content in the film, the left vertical axis represents the Hall effect mobility, and the right vertical axis represents the carrier density. This graph shows that as the Si content in the film is increased, the Hall effect mobility (indicated by a circle in the graph) and the carrier density (indicated by a cross in the graph) are decreased.

The graph of FIG. 4 shows the following results: when the Si content is 4 mol %, the carrier density is lower than or equal to $1 \times 10^{20}/cm^3$; similarly, when the Si content is 4 mol %, the Hall effect mobility is lower than or equal to 20 $cm^2/Vs$.

From the graphs of FIG. 3 and FIG. 4, it is found that inclusion of Si enables control of the carrier density of the oxide semiconductor film 50.

Note that a sample used in the measurement for obtaining the results shown in the graphs of FIG. 3 and FIG. 4 is a 150-nm-thick In—Si—Zn—O film which has been subjected to heat treatment at 450° C. for 1 hour in an $N_2$ atmosphere.

<Initial Characteristics of Field Effect Transistor Including In—Si—Zn—O Film>

FIG. 5, FIG. 6, FIG. 7, FIG. 8, FIG. 9, FIG. 10, FIG. 11, FIG. 12, FIG. 13, FIG. 14, FIG. 15, and FIG. 16 are graphs showing $I_d$-$V_g$ characteristics [log($I_d$)-$V_g$] of the field effect transistor illustrated in FIG. 1. In each of these graphs, the horizontal axis represents the level of gate voltage $V_g$ [V], the left vertical axis represents the amount of drain current $I_d$ [A] (indicated by a solid line in the graphs), and the right vertical axis represents the field effect mobility μFE [$cm^2$/Vs] (indicated by a dashed line in the graphs). Note that the $I_d$-$V_g$ characteristics were measured under the condition that the level of drain voltage $V_d$ [V] was 1 V or 10 V and a gate voltage $V_g$ [V] of −30 V to 30 V was applied.

Note that in a field effect transistor used for the measurement, a 100-nm-thick SiON film was used as the gate insulating film 40 and a 100-nm-thick Ti film was used as the metal film 60. In addition, the thickness of the oxide semiconductor film 50 was 20 nm, the channel length L was 10 μm, and the channel width W was 50 μm. The oxide semiconductor film 50 of the field effect transistor was formed in the following manner: a substrate at room temperature was subjected to sputtering using a DC power source of 100 W in an atmosphere where the ratio of gasses was Ar/$O_2$=67/33[%] and the total pressure was 0.4 Pa.

Figure 5:
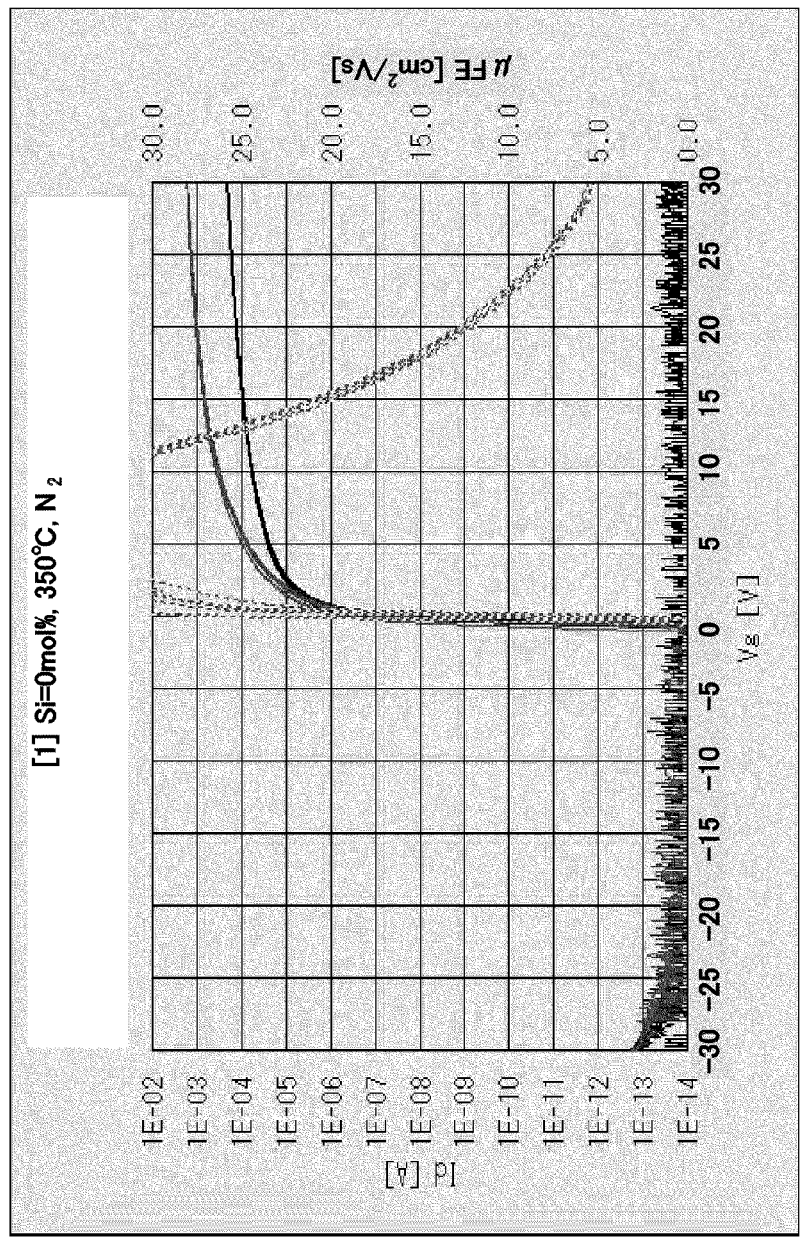
FIG. 5 is a graph showing initial characteristics of a field effect transistor ([1] Si=0 [mol %], and heat treatment condition is at 350° C. in an $N_2$ atmosphere)
Figure 6:
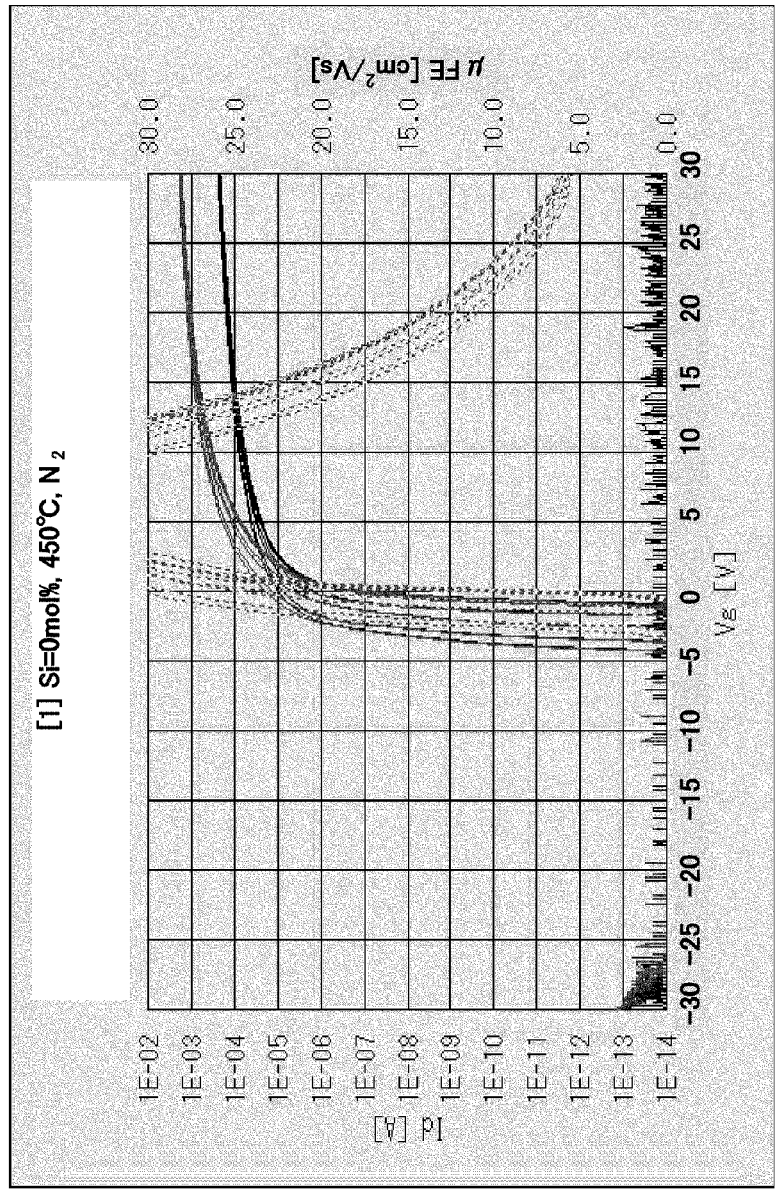
FIG. 6 is a graph showing initial characteristics of a field effect transistor ([1] Si=0 [mol %], and heat treatment condition is at 450° C. in an $N_2$ atmosphere)
Figure 7:
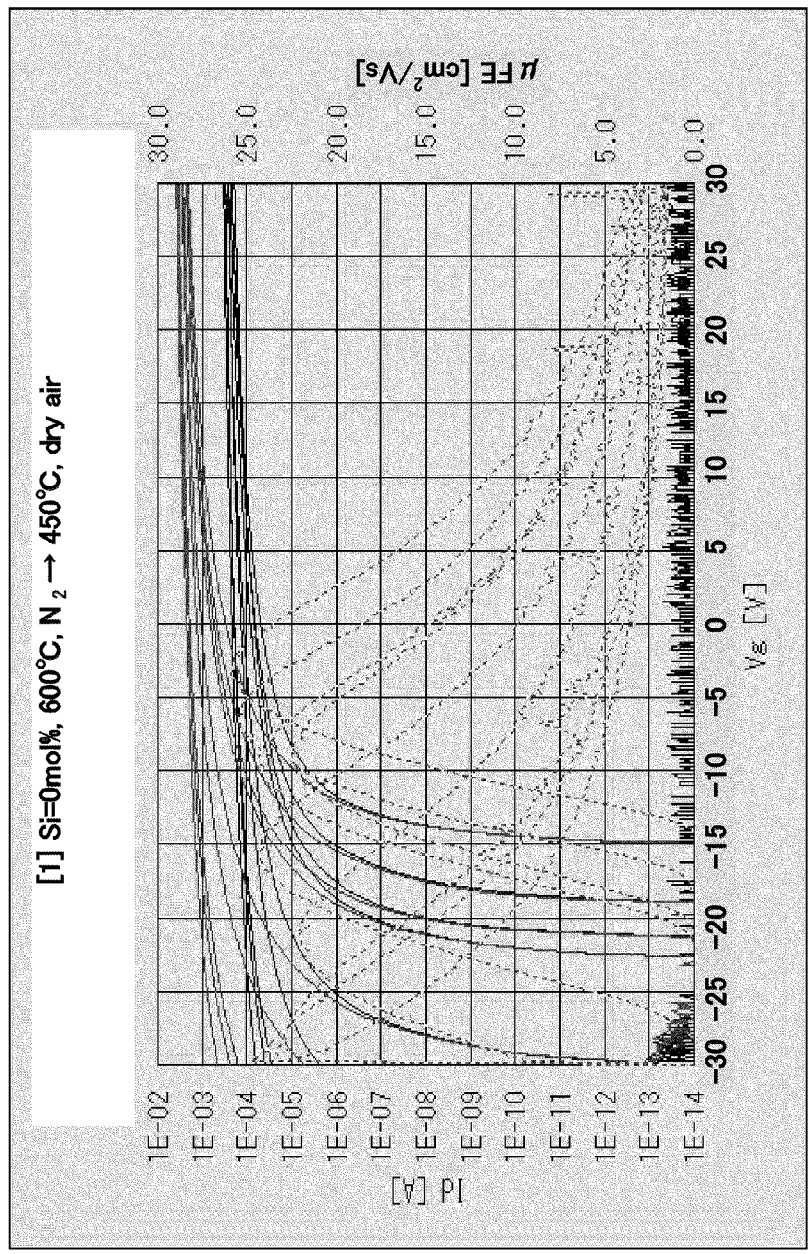
FIG. 7 is a graph showing initial characteristics of a field effect transistor ([1]Si=0 [mol %], and heat treatment condition is at 600° C. in an $N_2$ atmosphere and then changed to at 450° C. in dry air)

FIG. 5, FIG. 6, and FIG. 7 are graphs showing $I_d$-$V_g$ characteristics of field effect transistors in which the Si content in the oxide semiconductor film 50 is [1] Si=0 [mol %]. These three graphs show results of measuring $I_d$-$V_g$ characteristics of field effect transistors which were subjected to heat treatment under different conditions after the formation of the oxide semiconductor film 50. The field effect transistor of FIG. 5 was subjected to heat treatment at 350° C. for 1 hour in an $N_2$ atmosphere. The field effect transistor of FIG. 6 was subjected to heat treatment at 450° C. for 1 hour in an $N_2$ atmosphere. The field effect transistor of FIG. 7 was subjected to heat treatment at 600° C. for 1 hour in an $N_2$ atmosphere, and then subjected to heat treatment at 450° C. for 1 hour in an atmosphere of $N_2$:$O_2$=4:1 (hereinafter this atmosphere is also referred to as dry air).

FIG. 5 and FIG. 6 show that the off-state current of each of these field effect transistors is $1 \times 10^{-13}$ A or less, the on-state current thereof is $1 \times 10^{-5}$ A or more, and the on/off ratio thereof is $10^8$ or more; thus, excellent switching characteristics are obtained. Further, the field effect mobility μFE reaches 45 $cm^2$/Vs.

However, FIG. 7 shows that the field effect transistor does not have a sufficient on/off ratio. Further, the field effect transistor is normally on.

Figure 8:
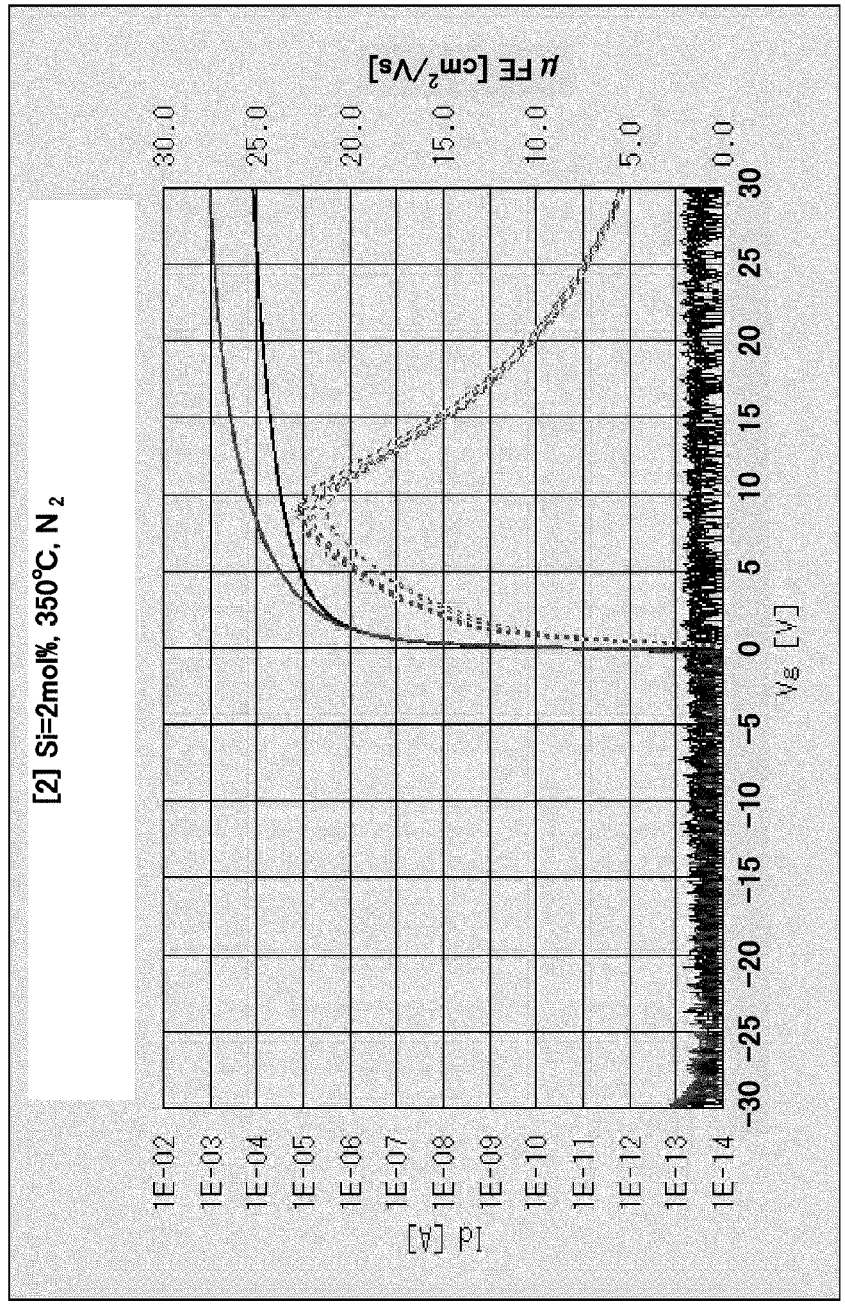
FIG. 8 is a graph showing initial characteristics of a field effect transistor ([2] Si=2 [mol %], and heat treatment condition is at 350° C. in an $N_2$ atmosphere)
Figure 9:
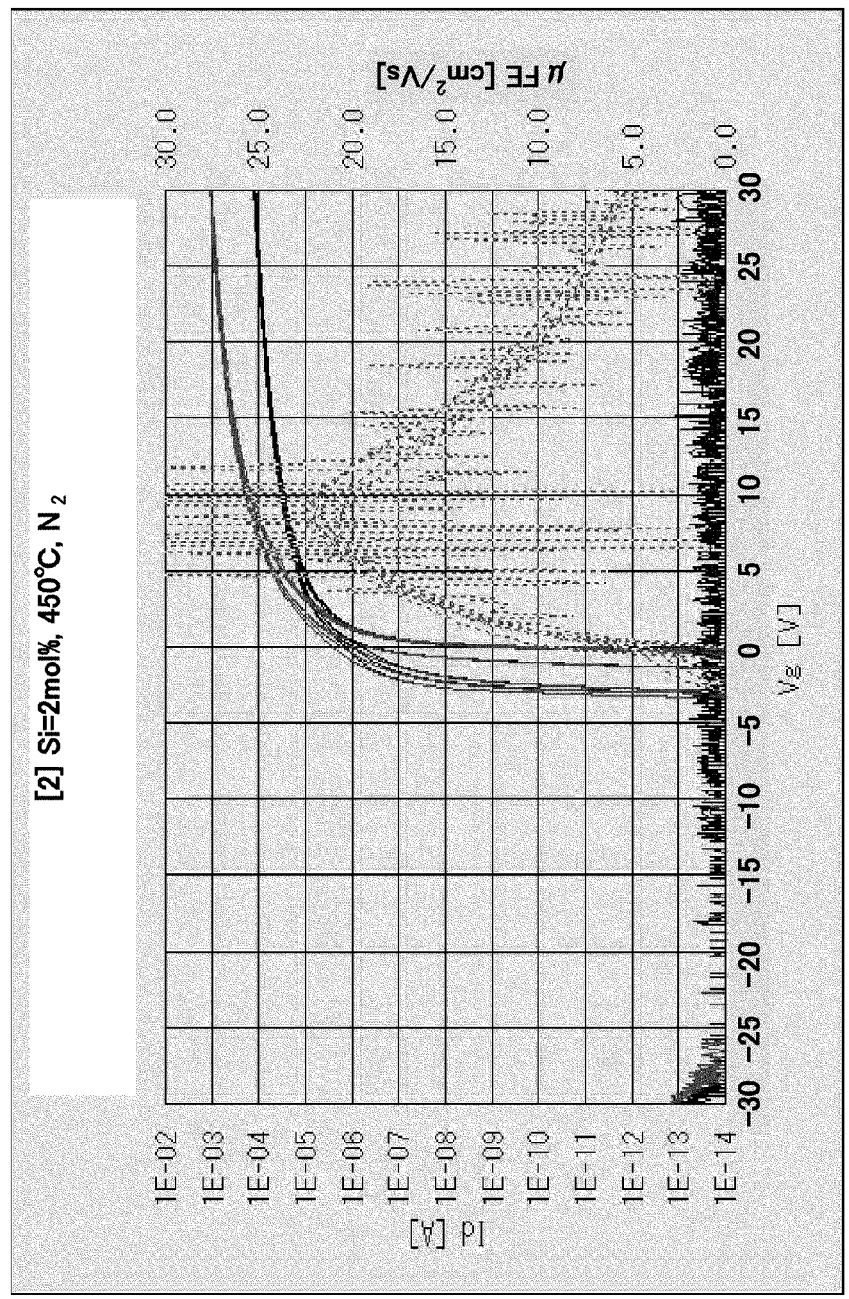
FIG. 9 is a graph showing initial characteristics of a field effect transistor ([2] Si=2 [mol %], and heat treatment condition is at 450° C. in an $N_2$ atmosphere)
Figure 10:
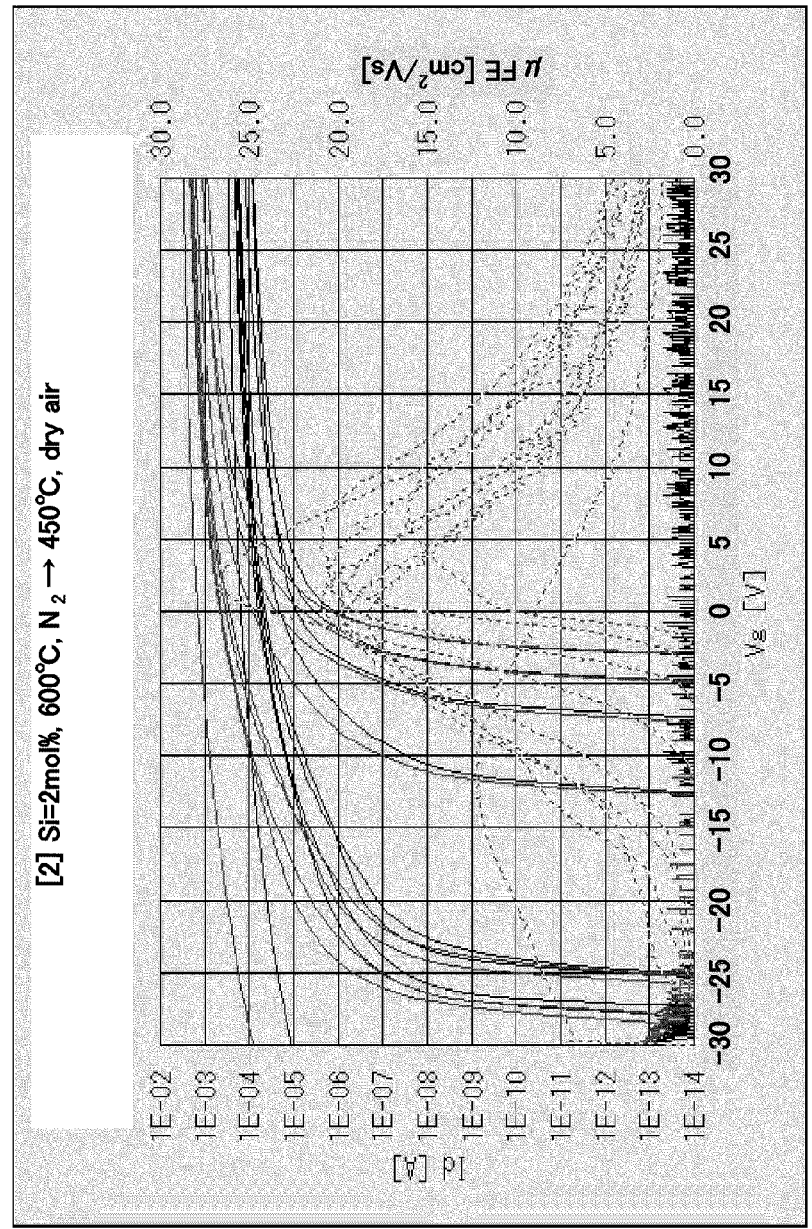
FIG. 10 is a graph showing initial characteristics of a field effect transistor ([2] Si=2 [mol %], and heat treatment condition is at 600° C. in an $N_2$ atmosphere and then changed to at 450° C. in dry air)

FIG. 8, FIG. 9, and FIG. 10 are graphs showing $I_d$-$V_g$ characteristics of field effect transistors in which Si content in the oxide semiconductor film 50 is [2] Si=2 [mol %]. These three graphs show results of measuring $I_d$-$V_g$ characteristics of field effect transistors which were subjected to heat treatment under different conditions after the formation of the oxide semiconductor film 50. The field effect transistor of FIG. 8 was subjected to heat treatment at 350° C. for 1 hour in an $N_2$ atmosphere. The field effect transistor of FIG. 9 was subjected to heat treatment at 450° C. for 1 hour in an $N_2$ atmosphere. The field effect transistor of FIG. 10 was subjected to heat treatment at 600° C. for 1 hour in an $N_2$ atmosphere, and then subjected to heat treatment at 450° C. for 1 hour in an atmosphere of $N_2$:$O_2$=4:1 (dry air).

FIG. 8 and FIG. 9 show that the off-state current of each of these field effect transistors is $1 \times 10^{-13}$ A or less, the on-state current thereof is $1 \times 10^{-5}$ A or more, and the on/off ratio thereof is $10^8$ or more; thus, excellent switching characteristics are obtained. Further, the field effect mobility μFE reaches 22 $cm^2$/Vs.

However, FIG. 10 shows that the field effect transistor does not have a sufficient on/off ratio. Further, the field effect transistor is normally on.

Figure 11:
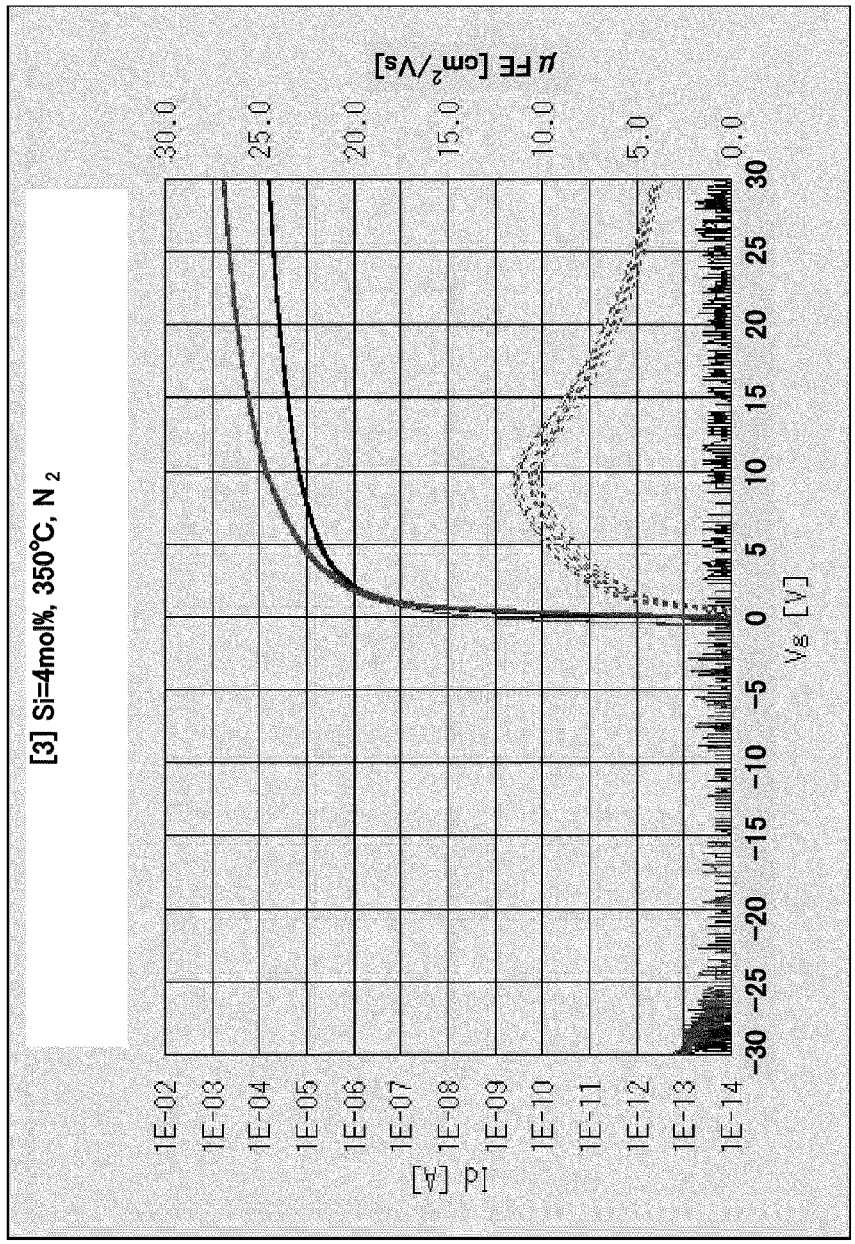
FIG. 11 is a graph showing initial characteristics of a field effect transistor ([3] Si=4 [mol %], and heat treatment condition is at 350° C. in an $N_2$ atmosphere)
Figure 12:
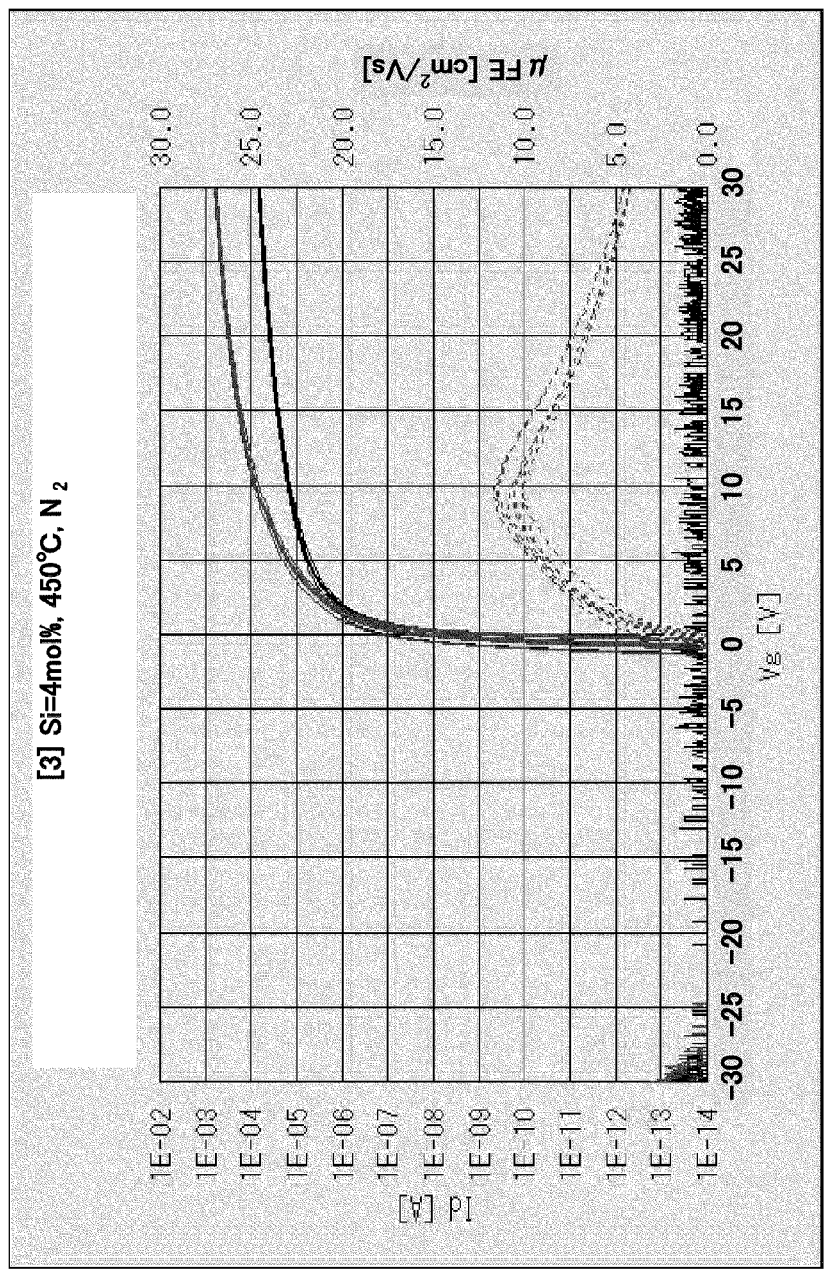
FIG. 12 is a graph showing initial characteristics of a field effect transistor ([3] Si=4 [mol %], and heat treatment condition is at 450° C. in an $N_2$ atmosphere)
Figure 13:
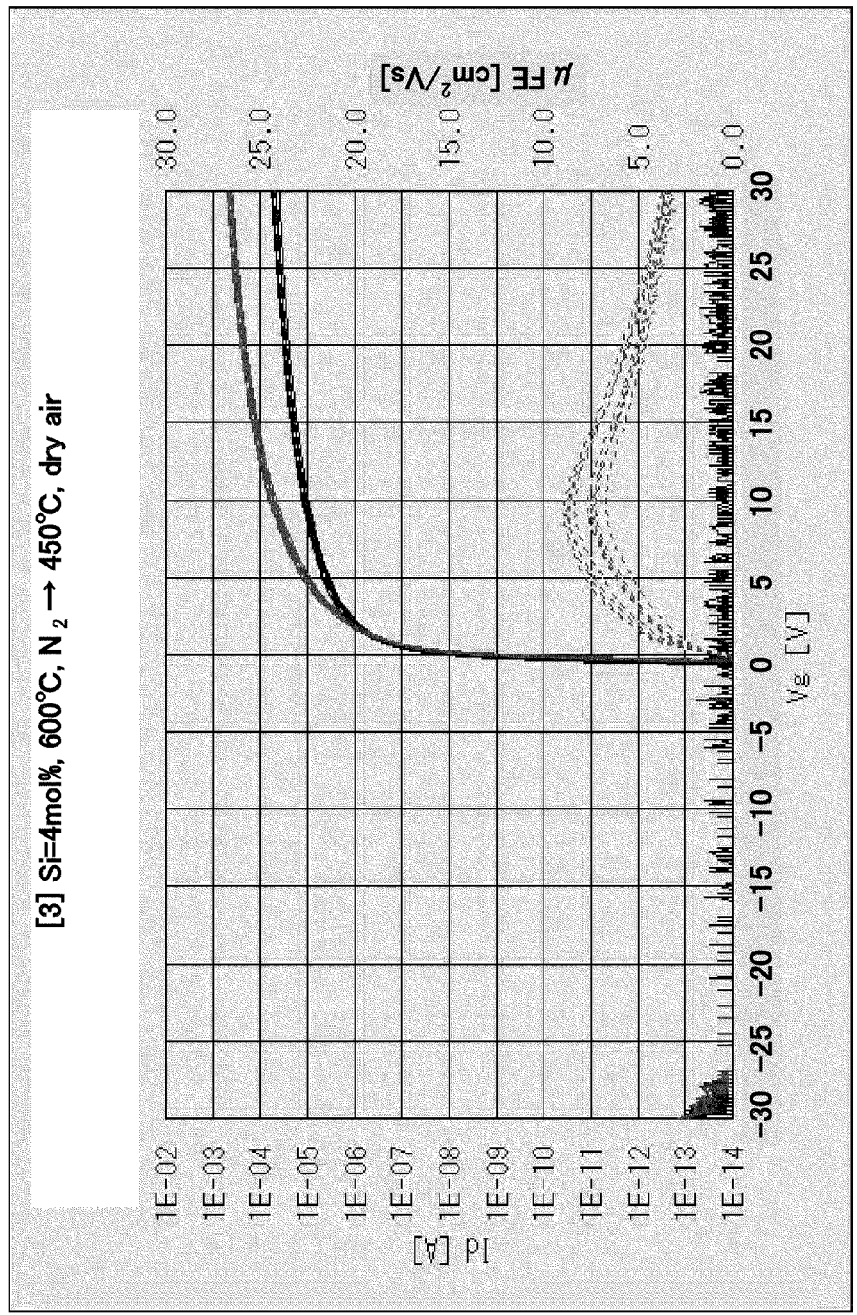
FIG. 13 is a graph showing initial characteristics of a field effect transistor ([3] Si=4 [mol %], and heat treatment condition is at 600° C. in an $N_2$ atmosphere and then changed to at 450° C. in dry air)

FIG. 11, FIG. 12, and FIG. 13 are graphs showing $I_d$-$V_g$ characteristics of field effect transistors in which Si content in the oxide semiconductor film 50 is [3] Si=4 [mol %]. These three graphs show results of measuring $I_d$-$V_g$ characteristics of field effect transistors which were subjected to heat treatment under different conditions after the formation of the oxide semiconductor film 50. The field effect transistor of FIG. 11 was subjected to heat treatment at 350° C. for 1 hour in an $N_2$ atmosphere. The field effect transistor of FIG. 12 was subjected to heat treatment at 450° C. for 1 hour in an $N_2$ atmosphere. The field effect transistor of FIG. 13 was subjected to heat treatment at 600° C. for 1 hour in an $N_2$ atmosphere, and then subjected to heat treatment at 450° C. for 1 hour in an atmosphere of $N_2$:$O_2$=4:1 (dry air).

FIG. 11, FIG. 12, and FIG. 13 show that the off-state current of each of these field effect transistors is $1 \times 10^{-13}$ A or less, the on-state current thereof is $1 \times 10^{-5}$ A or more, and the on/off ratio thereof is $10^8$ or more; thus, excellent switching characteristics are obtained. Further, the field effect mobility μFE reaches 10 $cm^2$/Vs.

Figure 14:
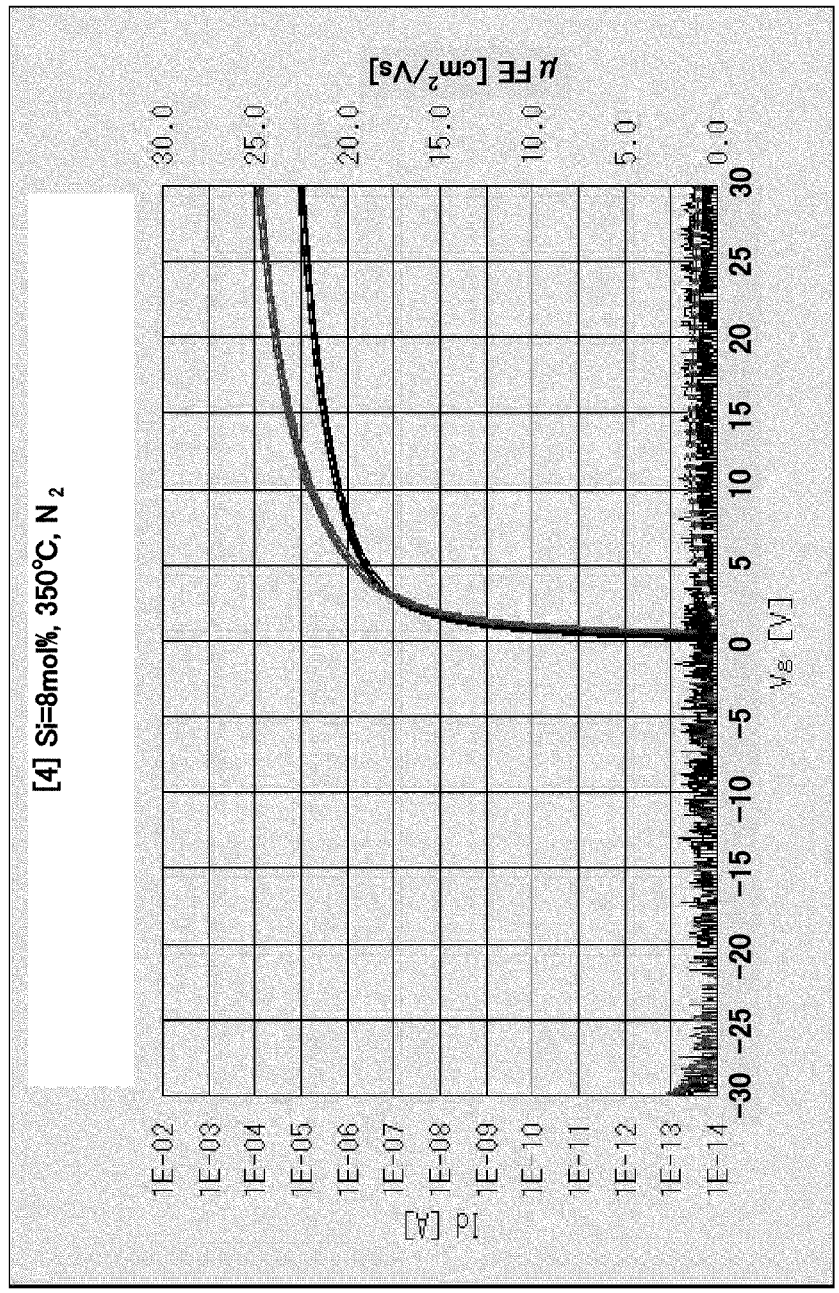
FIG. 14 is a graph showing initial characteristics of a field effect transistor ([4] Si=8 [mol %], and heat treatment condition is at 350° C. in an $N_2$ atmosphere)
Figure 15:
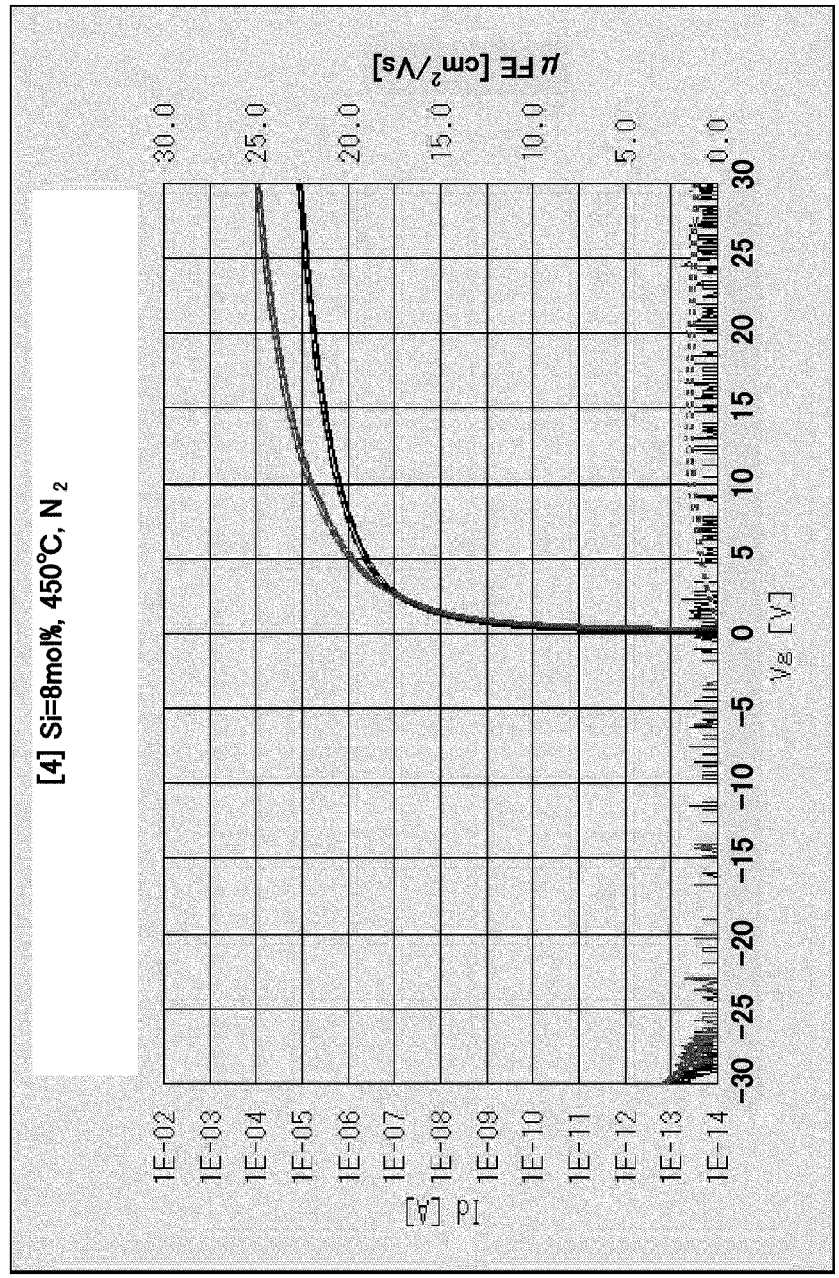
FIG. 15 is a graph showing initial characteristics of a field effect transistor ([4] Si=8 [mol %], and heat treatment condition is at 450° C. in an $N_2$ atmosphere)
Figure 16:
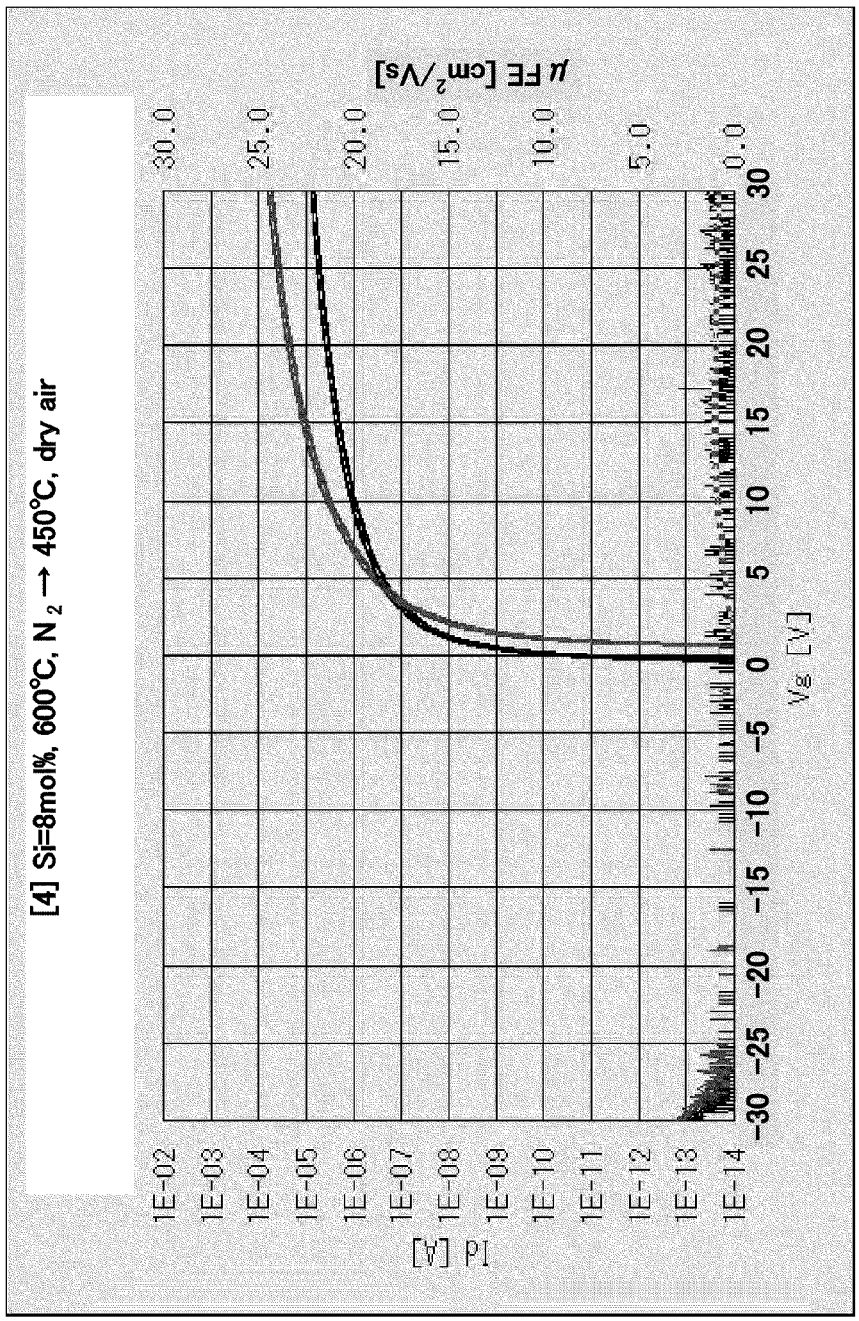
FIG. 16 is a graph showing initial characteristics of a field effect transistor ([4]Si=8 [mol %], and heat treatment condition is at 600° C. in an $N_2$ atmosphere and then changed to at 450° C. in dry air)

FIG. 14, FIG. 15, and FIG. 16 are graphs showing $I_d$-$V_g$ characteristics of field effect transistors in which Si content in the oxide semiconductor film 50 is [4] Si=8 [mol %]. These three graphs show results of measuring $I_d$-$V_g$ characteristics of field effect transistors which were subjected to heat treatment under different conditions after the formation of the oxide semiconductor film 50. The field effect transistor of FIG. 14 was subjected to heat treatment at 350° C. for 1 hour in an $N_2$ atmosphere. The field effect transistor of FIG. 15 was subjected to heat treatment at 450° C. for 1 hour in an $N_2$ atmosphere. The field effect transistor of FIG. 16 was subjected to heat treatment at 600° C. for 1 hour in an $N_2$ atmosphere, and then subjected to heat treatment at 450° C. for 1 hour in an atmosphere of $N_2:O_2=4:1$ (dry air).

FIG. 14, FIG. 15, and FIG. 16 show that the off-state current of each of these field effect transistors is $1\times10^{-13}$ A or less, the on-state current thereof is $1\times10^{-6}$ A or more, and the on/off ratio thereof is $10^7$ or more; thus, excellent switching characteristics are obtained. However, the field effect mobility µFE is very low.

These graphs show that as the Si content is increased, the field effect mobility of the transistor is decreased. On the other hand, it is found that in the case where Si is not included or the Si content is small, the threshold voltage is decreased and the transistor is normally on as the temperature of heat treatment performed after the formation of the oxide semiconductor film 50 is raised.

<Results of BT Test Performed on Field Effect Transistor Including In—Si—Zn—O Film>

FIG. 17, FIG. 18, FIG. 19, FIG. 20, FIG. 21, FIG. 22, FIG. 23, and FIG. 24 are graphs showing results of bias-temperature (BT) tests performed on the transistor illustrated in FIG. 1. In each of these graphs, the horizontal axis represents the level of gate voltage $V_g$ [V], the left vertical axis represents the amount of drain current $I_d$ [A] (in the graphs, a heavy solid line shows results before the test and a heavy dashed line shows results after the test), and the right vertical axis represents the field effect mobility µFE [cm$^2$/Vs] (in the graphs, a solid line shows results before the test and a dashed line shows results after the test).

The field effect transistor used for the measurement was manufactured in the following manner. A SiON film was formed to a thickness of 100 nm as the gate insulating film 40, and then the oxide semiconductor film 50 is formed to a thickness of 20 nm. After that, heat treatment was performed at 350° C. for 1 hour in an atmosphere of $N_2:O_2=4:1$ (dry air). A 100-nm-thick Ti film was formed as the metal film 60, and then heat treatment was performed at 250° C. for 1 hour in an $N_2$ atmosphere. In addition, the channel length L of the field effect transistor was 20 µm and the channel width W thereof was 20 µm.

The BT tests was performed under the condition that a gate voltage of 20 V (+BT) or a gate voltage of −20 V (−BT) was applied at 150° C. for 1 hour. Note that in the BT test, the level of drain voltage $V_d$ [V] was set at 1 V or 10 V.

Figure 17:
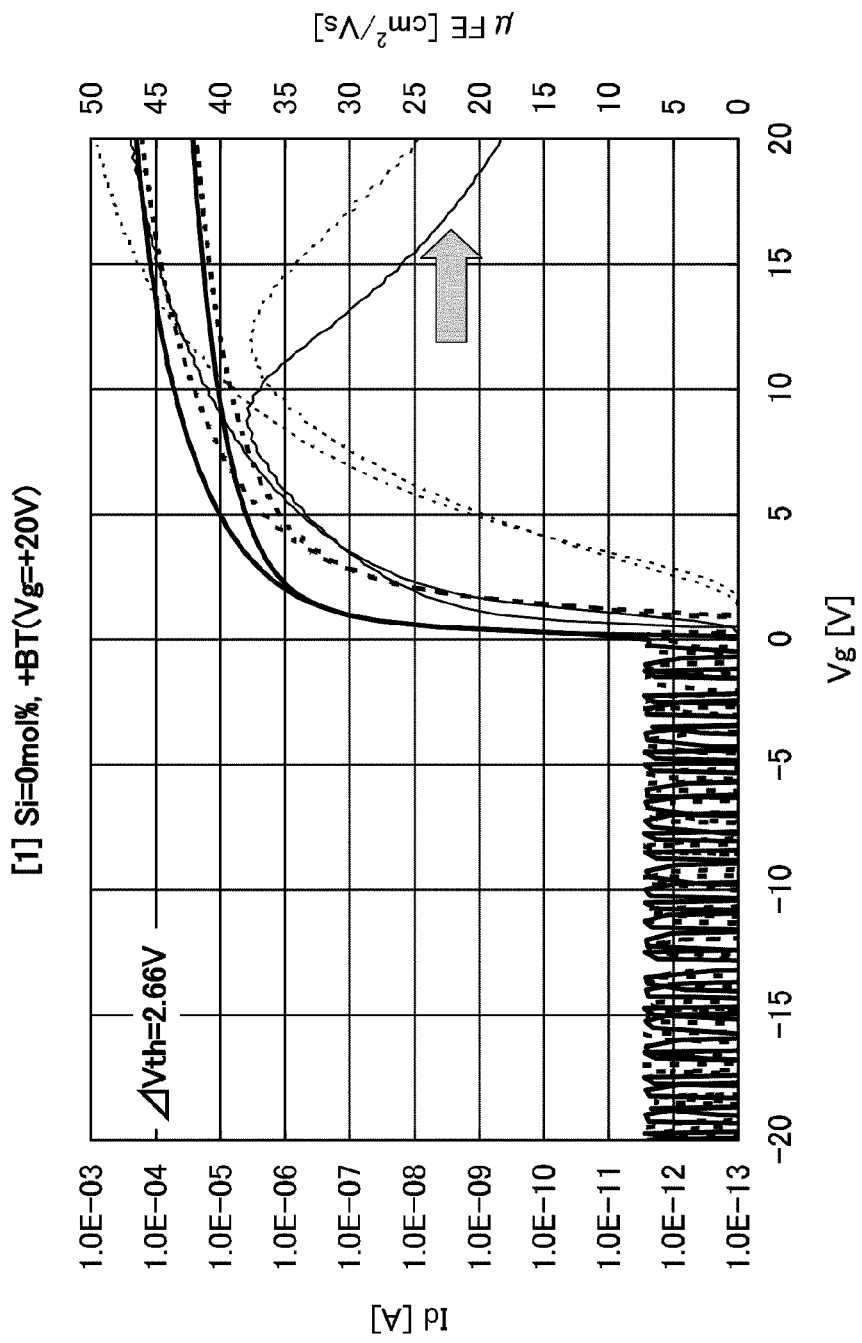
FIG. 17 is a graph showing results of a +BT test performed on a field effect transistor ([1] Si=0 [mol %])
Figure 18:
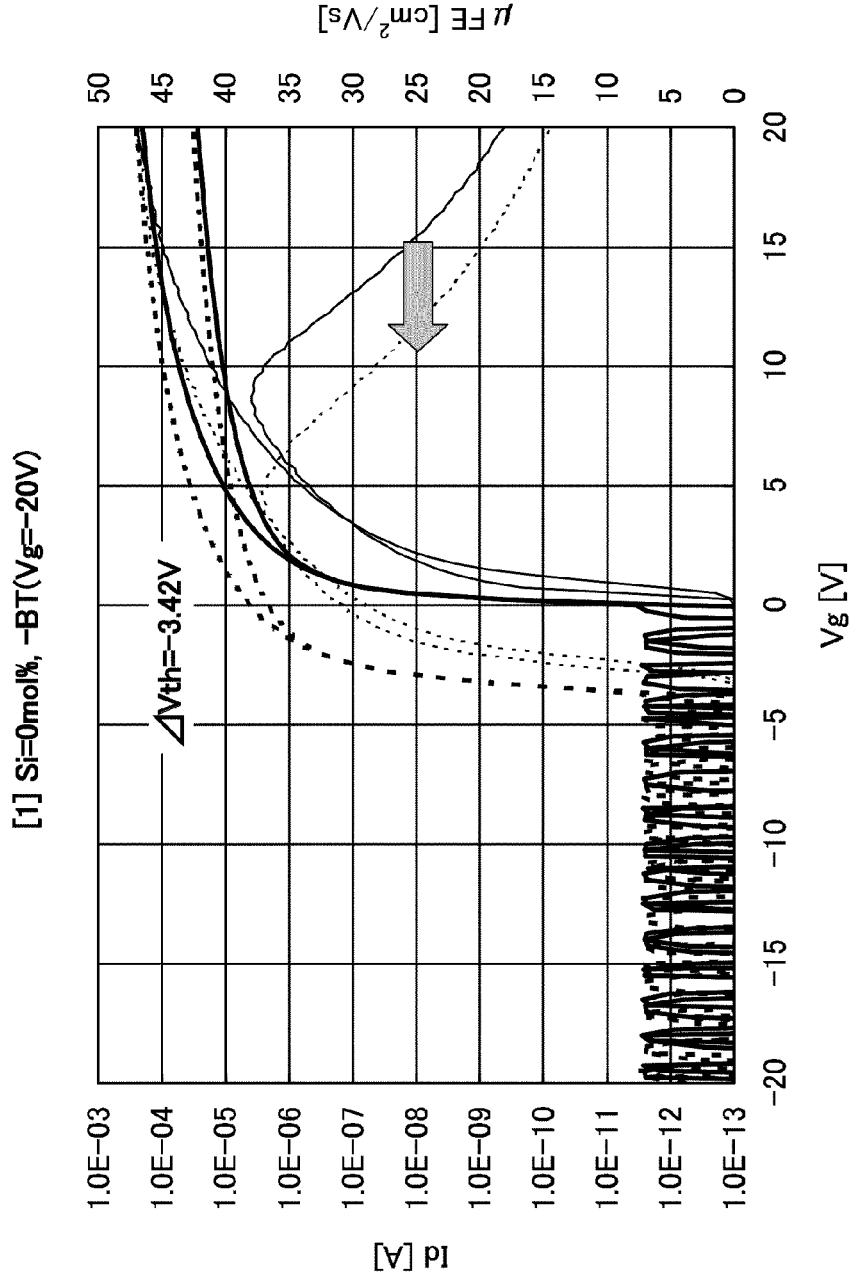
FIG. 18 is a graph showing results of a −BT test performed on the field effect transistor ([1] Si=0 [mol %])

FIG. 17 and FIG. 18 are graphs showing results of the test performed on a field effect transistor in which the Si content in the oxide semiconductor film 50 is [1] Si=0 [mol %]. FIG. 17 shows results of a +BT test, and the amount of shift in the threshold voltage is 2.66 V. FIG. 18 shows results of a −BT test, and the amount of shift in the threshold voltage is −3.42 V.

Figure 19:
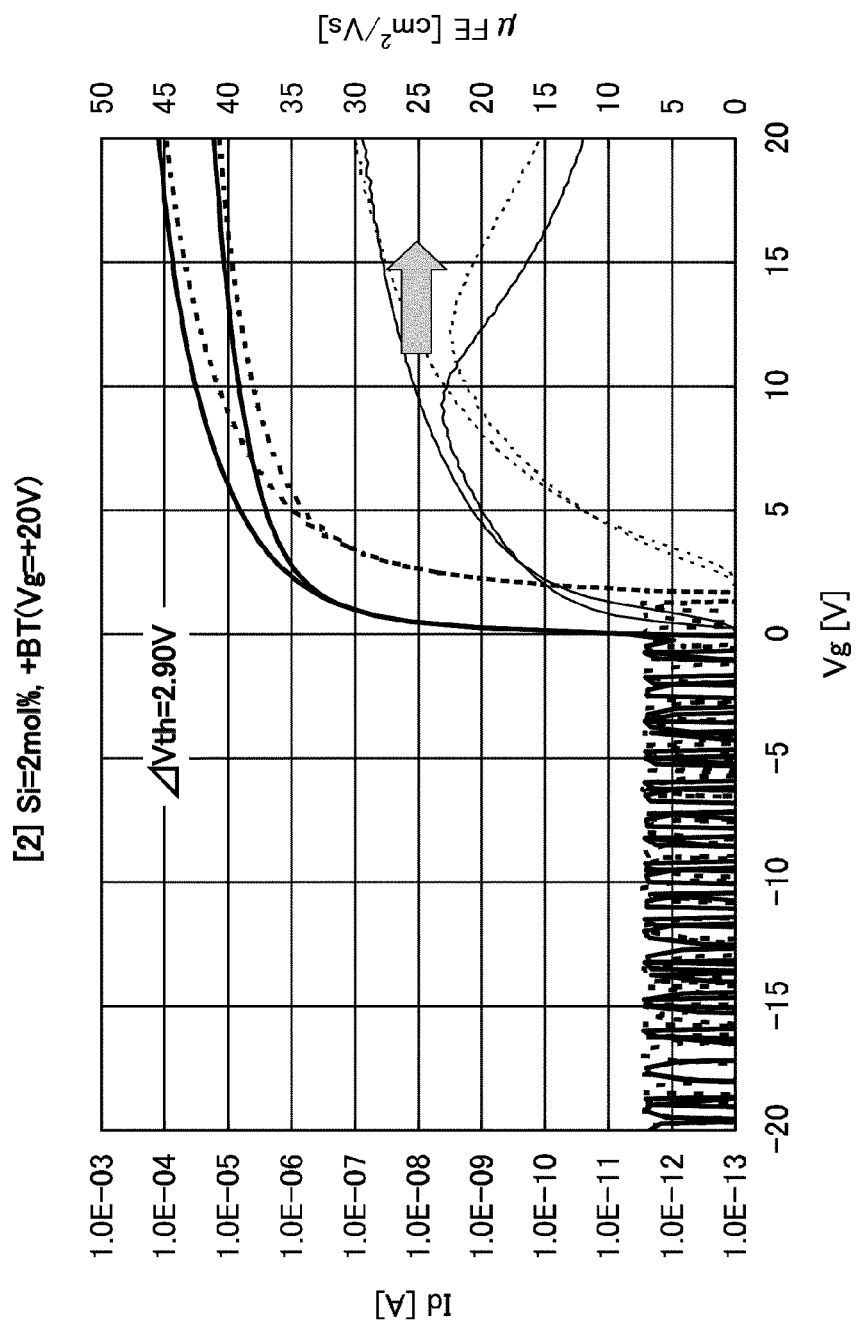
FIG. 19 is a graph showing results of a +BT test performed on a field effect transistor ([2] Si=2 [mol %])
Figure 20:
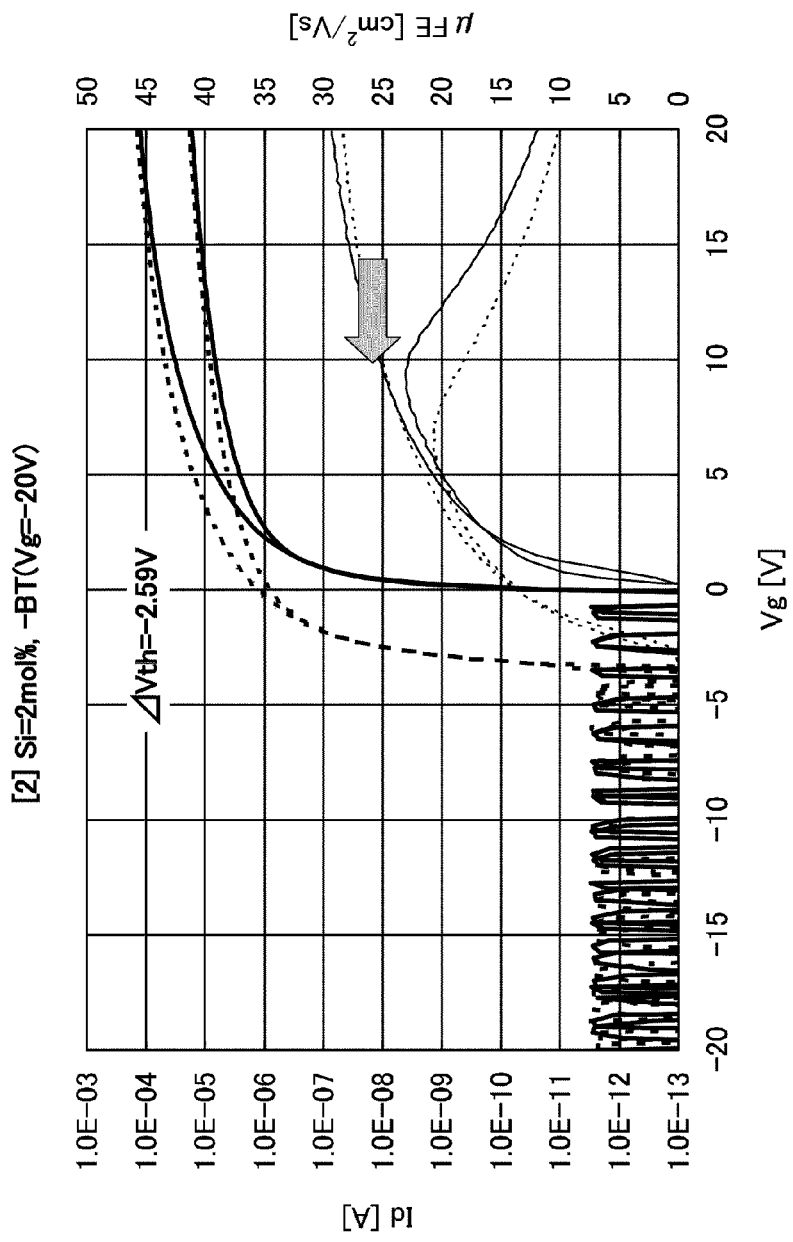
FIG. 20 is a graph showing results of a −BT test performed on the field effect transistor ([2] Si=2 [mol %])

FIG. 19 and FIG. 20 are graphs showing results of the test performed on a field effect transistor in which the Si content in the oxide semiconductor film 50 is [2] Si=2 [mol %]. FIG. 19 shows results of a +BT test, and the amount of shift in the threshold voltage is 2.90 V. FIG. 20 shows results of a −BT test, and the amount of shift in the threshold voltage is −2.59 V.

Figure 21:
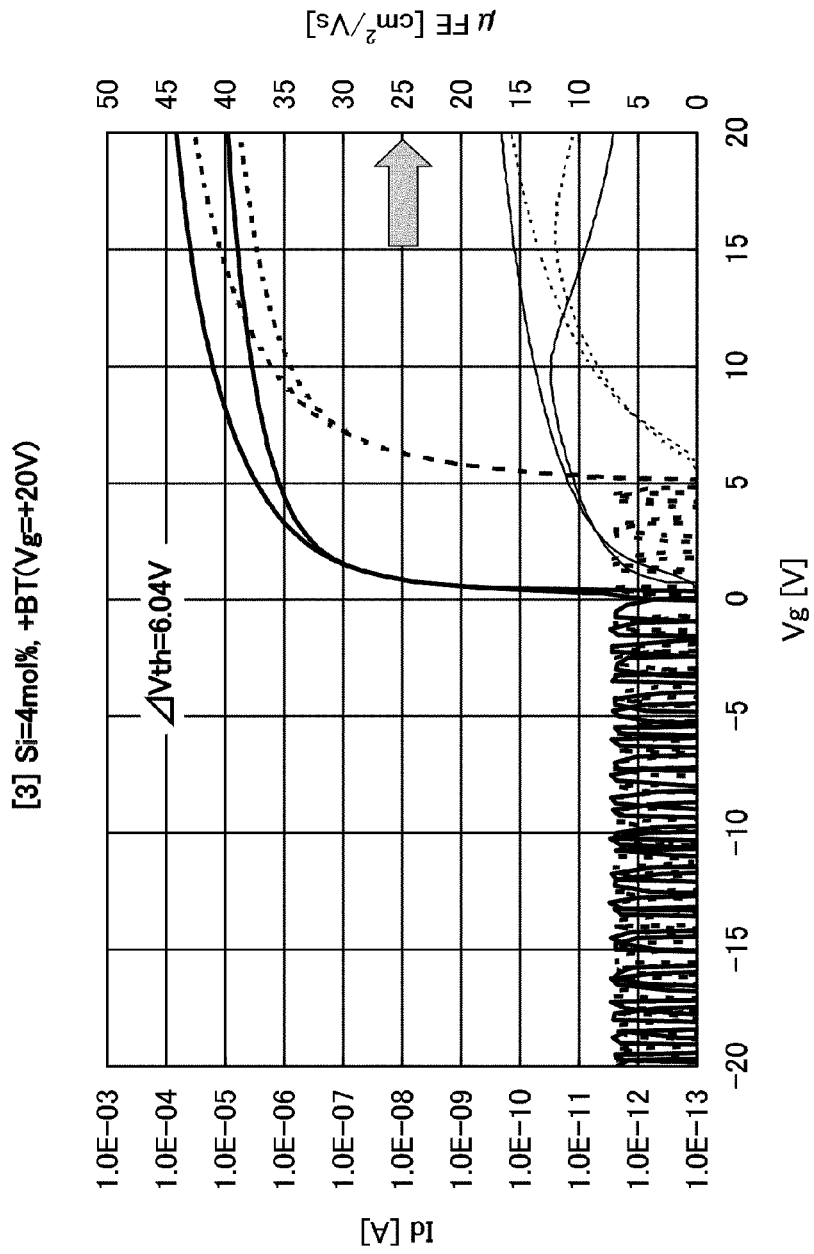
FIG. 21 is a graph showing results of a +BT test performed on a field effect transistor ([3] Si=4 [mol %])
Figure 22:
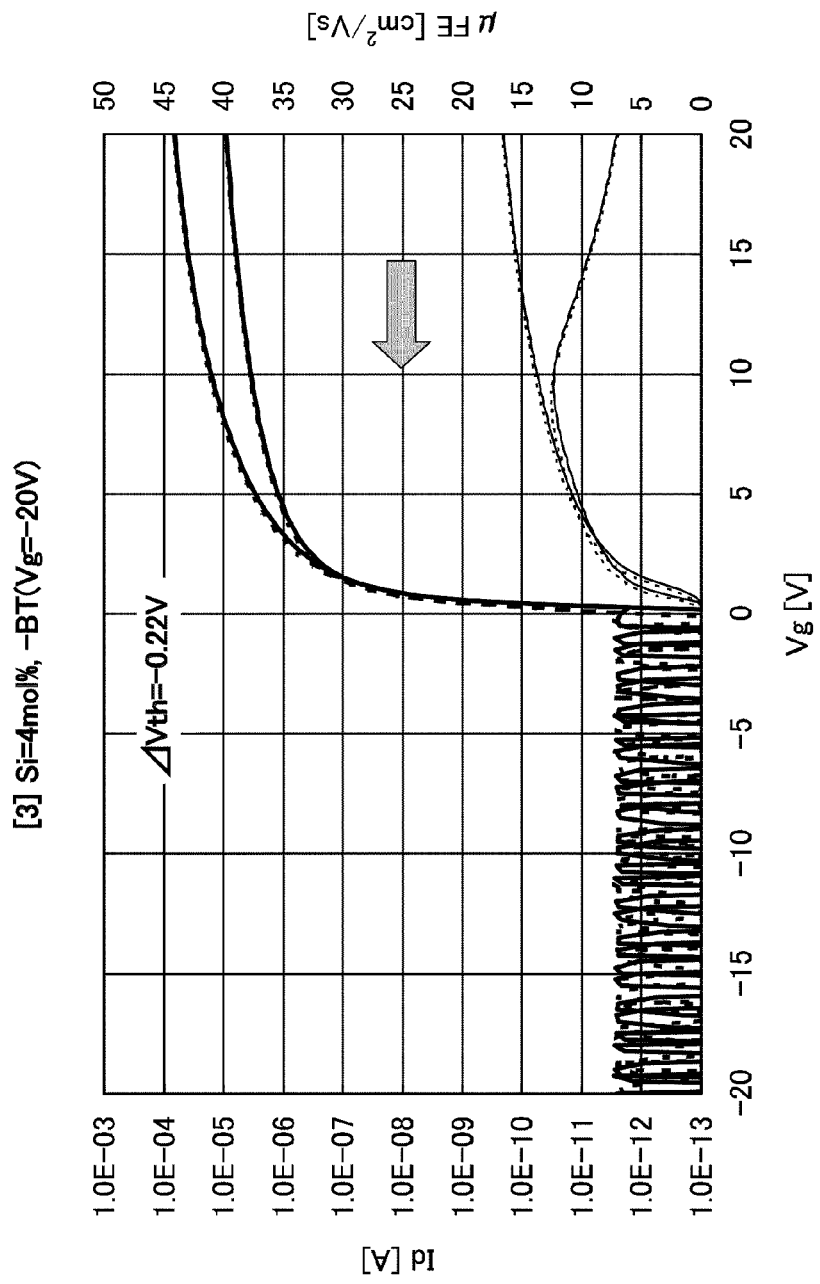
FIG. 22 is a graph showing results of a −BT test performed on the field effect transistor ([3] Si=4 [mol %])

FIG. 21 and FIG. 22 are graphs showing results of the test performed on a field effect transistor in which the Si content in the oxide semiconductor film 50 is [3] Si=4 [mol %]. FIG. 21 shows results of a +BT test, and the amount of shift in the threshold voltage is 6.04 V. FIG. 22 shows results of a −BT test, and the amount of shift in the threshold voltage is −0.22 V.

Figure 23:
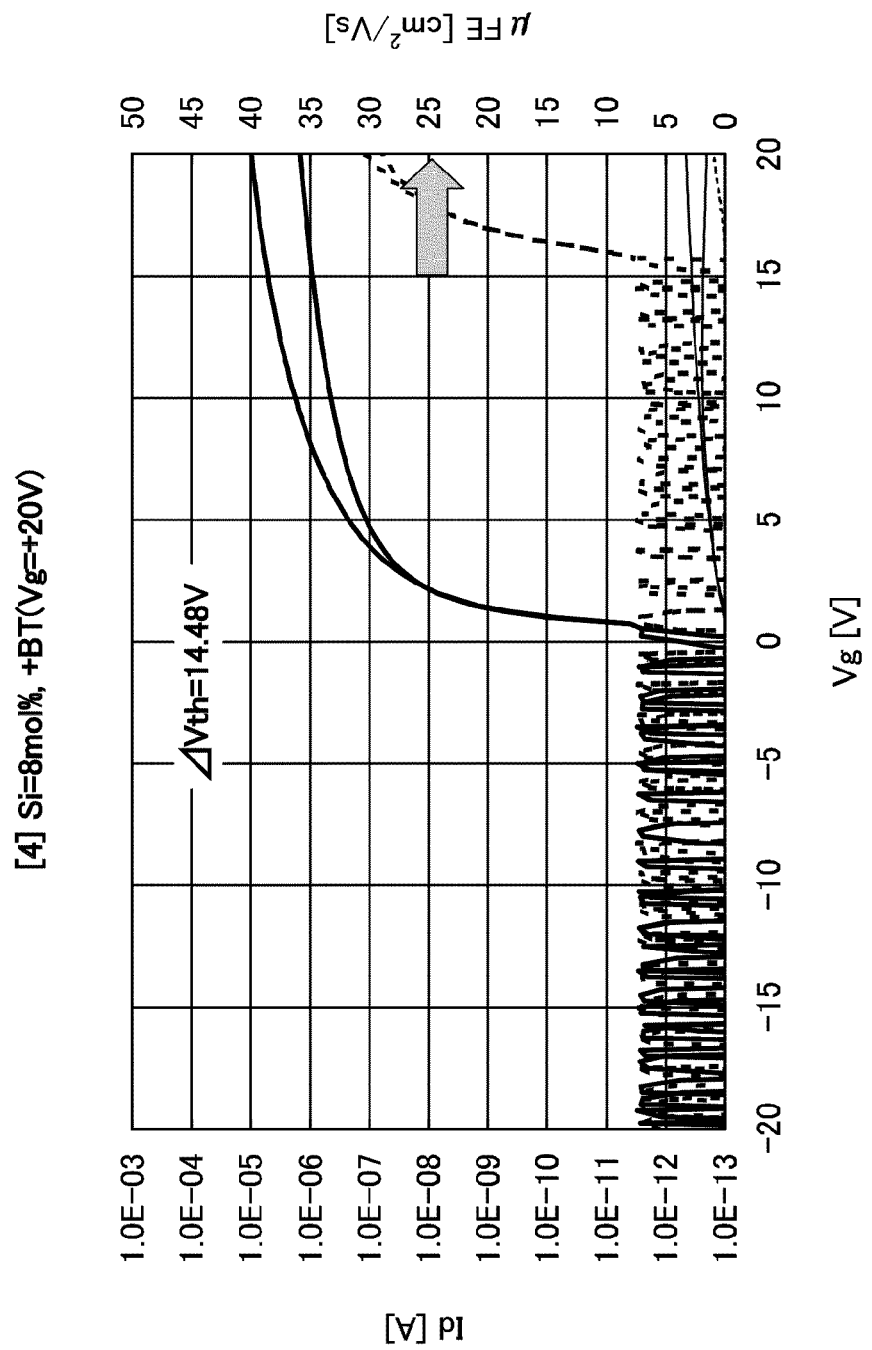
FIG. 23 is a graph showing results of a +BT test performed on a field effect transistor ([4] Si=8 [mol %])
Figure 24:
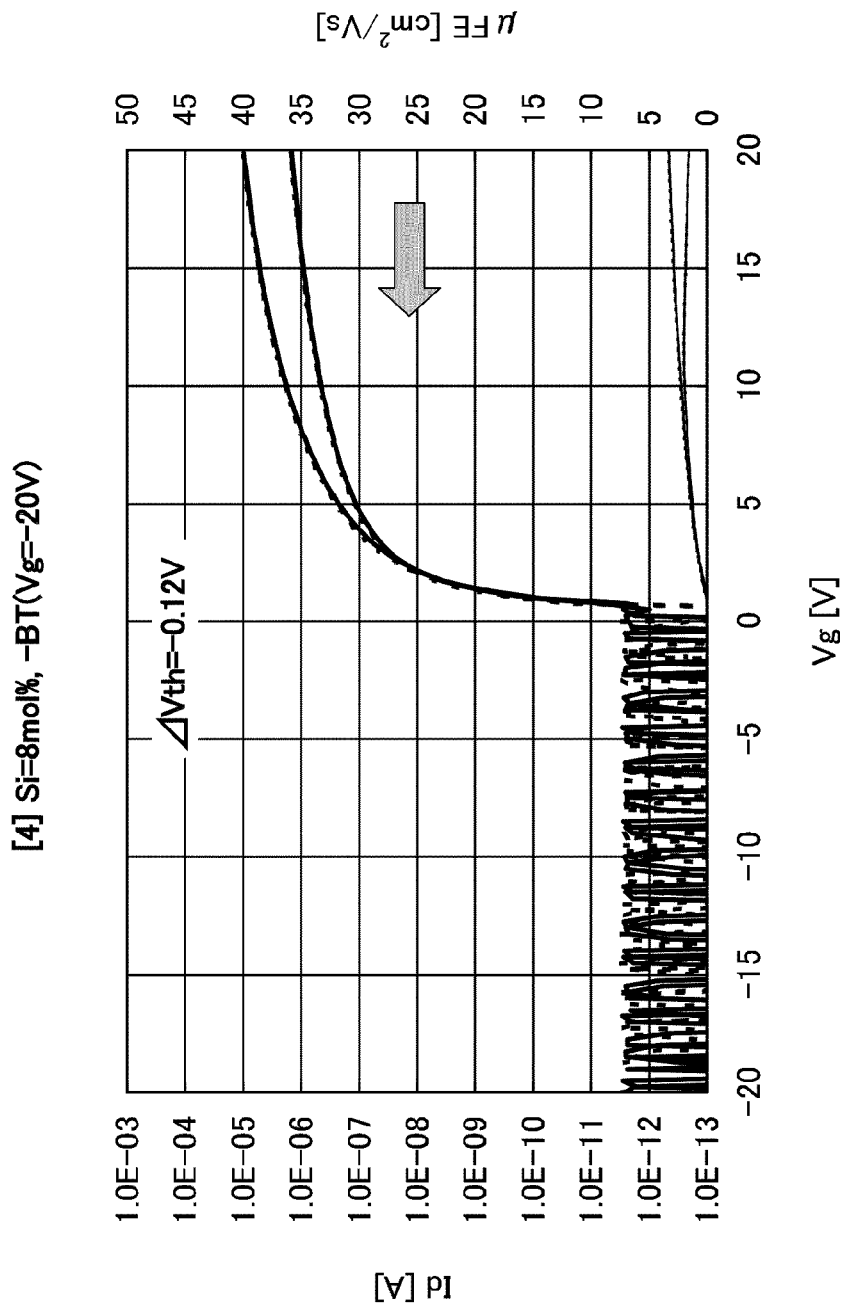
FIG. 24 is a graph showing results of a −BT test performed on the field effect transistor ([4] Si=8 [mol %])

FIG. 23 and FIG. 24 are graphs showing results of the test performed on a field effect transistor in which the Si content in the oxide semiconductor film 50 is [4] Si=8 [mol %]. FIG. 23 shows results of a +BT test, and the amount of shift in the threshold voltage is 14.48 V. FIG. 24 shows results of a −BT test, and the amount of shift in the threshold voltage is −0.12 V.

These graphs show that as the Si content is increased, the amount of shift in the threshold voltage due to the +BT test is increased while the amount of shift in the threshold voltage due to the −BT test is decreased. Accordingly, it is effective for an element to which −BT stress is always applied to include Si. Note that in the case where the Si content is small, a significant effect on improvement in the shift of the threshold voltage due to the −BT test is not obtained.

Consequently, with the use of an In—Si—Zn—O film in which the Si content is greater than or equal to 4 mol % and less than or equal to 8 mol %, a field effect transistor which can withstand heat treatment at a high temperature and is effective against −BT stress can be manufactured.

This application is based on Japanese Patent Application serial no. 2009-281408 filed with Japan Patent Office on Dec. 11, 2009, the entire contents of which are hereby incorporated by reference.

Reference Numerals

10: substrate, 20: base insulating film, 30: gate electrode, 35: conductive film, 40: gate insulating film, 50: oxide semiconductor film, 55: oxide semiconductor film, 60: metal film, 65: metal film.

The invention claimed is:

1. A field effect transistor comprising:
a substrate;
a gate electrode over the substrate;
a gate insulating film over the gate electrode;
an oxide semiconductor film over the gate insulating film; and
a source electrode and a drain electrode over the oxide semiconductor film,
wherein the oxide semiconductor film comprises indium and zinc,
wherein the oxide semiconductor film includes a taper shaped depression of a first taper angle between the source electrode and the drain electrode,
wherein each of the source electrode and the drain electrode includes a taper shaped edge of a second taper angle, and
wherein the first taper angle is different from the second taper angle.

2. The field effect transistor according to claim 1, further comprising an insulating film between the substrate and the gate electrode.

3. The field effect transistor according to claim 1, a concentration of hydrogen in the oxide semiconductor film is $5\times10^{19}$ atoms/cm$^3$ or lower.

4. The field effect transistor according to claim 1, wherein the oxide semiconductor film comprises silicon.

5. The field effect transistor according to claim 4, wherein a content of silicon in the oxide semiconductor film is greater than or equal to 4 mol% and less than or equal to 8 mol%.

6. A field effect transistor comprising:
a substrate;
a gate electrode over the substrate;

a gate insulating film over the gate electrode;
an oxide semiconductor film over the gate insulating film; and;
a source electrode and a drain electrode over the oxide semiconductor film,
wherein the oxide semiconductor film comprises indium and zinc,
wherein an electron carrier density of the oxide semiconductor film is $1\times10^{20}$ /cm$^3$ or lower,
wherein the oxide semiconductor film includes a taper shaped depression of a first taper angle between the source electrode and the drain electrode,
wherein each of the source electrode and the drain electrode includes a taper shaped edge of a second taper angle, and
wherein the first taper angle is different from the second taper angle.

7. The field effect transistor according to claim 6, further comprising an insulating film between the substrate and the gate electrode.

8. The field effect transistor according to claim 6, a concentration of hydrogen in the oxide semiconductor film is $5\times10^{19}$ atoms/cm$^3$ or lower.

9. The field effect transistor according to claim 6, wherein the oxide semiconductor film comprises silicon.

10. A field effect transistor comprising:
a substrate;
a gate electrode over the substrate;
a gate insulating film over the gate electrode;
an oxide semiconductor film over the gate insulating film; and
a source electrode and a drain electrode over the oxide semiconductor film,
wherein the oxide semiconductor film comprises indium and zinc,
wherein Hall effect mobility of the oxide semiconductor film is 20 cm$^2$/Vs or lower,
wherein the oxide semiconductor film includes a taper shaped depression of a first taper angle between the source electrode and the drain electrode,
wherein each of the source electrode and the drain electrode includes a taper shaped edge of a second taper angle, and
wherein the first taper angle is different from the second taper angle.

11. The field effect transistor according to claim 10, further comprising an insulating film between the substrate and the gate electrode.

12. The field effect transistor according to claim 10, a concentration of hydrogen in the oxide semiconductor film is $5\times10^{19}$ atoms/cm$^3$ or lower.

13. The field effect transistor according to claim 10, wherein the oxide semiconductor film comprises silicon.

* * * * *